(12) United States Patent
Ikeda et al.

(10) Patent No.: US 8,274,214 B2
(45) Date of Patent: Sep. 25, 2012

(54) LIGHT EMITTING ELEMENT, LIGHT EMITTING DEVICE, AND ELECTRONIC DEVICE

(75) Inventors: Kaoru Ikeda, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 368 days.

(21) Appl. No.: 12/546,015

(22) Filed: Aug. 24, 2009

(65) Prior Publication Data

US 2010/0052527 A1 Mar. 4, 2010

(30) Foreign Application Priority Data

Sep. 1, 2008 (JP) .................................. 2008-223217

(51) Int. Cl.
*H01L 51/50* (2006.01)
*H01L 51/54* (2006.01)
(52) U.S. Cl. ..................... 313/504; 313/503; 428/690
(58) Field of Classification Search .......... 313/500–512; 428/690
See application file for complete search history.

(56) References Cited

U.S. PATENT DOCUMENTS

| | | | |
|---|---|---|---|
| 5,283,132 A | 2/1994 | Ogura et al. | |
| 6,303,238 B1 | 10/2001 | Thompson et al. | |
| 6,310,360 B1 | 10/2001 | Forrest et al. | |
| 6,420,031 B1 | 7/2002 | Parthasarathy et al. | |
| 6,515,298 B2 | 2/2003 | Forrest et al. | |
| 6,614,176 B2 | 9/2003 | Kim et al. | |
| 6,894,307 B2 | 5/2005 | Forrest et al. | |
| 6,995,509 B2 | 2/2006 | Yamazaki et al. | |
| 7,009,338 B2 | 3/2006 | D'Andrade et al. | |
| 7,474,049 B2 * | 1/2009 | Liu et al. | 313/504 |
| 7,601,435 B2 | 10/2009 | Shitagaki et al. | |
| 2001/0043046 A1 | 11/2001 | Fukunaga | |
| 2001/0043168 A1 | 11/2001 | Koyama et al. | |
| 2001/0053462 A1 | 12/2001 | Mishima | |
| 2002/0008233 A1 | 1/2002 | Forrest et al. | |
| 2002/0015859 A1 | 2/2002 | Watanabe et al. | |
| 2002/0027416 A1 | 3/2002 | Kim et al. | |

(Continued)

FOREIGN PATENT DOCUMENTS

JP 4-284395 10/1992

(Continued)

OTHER PUBLICATIONS

Baldo, M.A. et al, "Highly Efficient Phosphorescent Emission from Organic Electroluminescent Devices," Nature, vol. 395, Sep. 10, 1998, pp. 151-154.

(Continued)

*Primary Examiner* — Mariceli Santiago
(74) *Attorney, Agent, or Firm* — Husch Blackwell LLP

(57) ABSTRACT

An object is to improve luminous efficiency of a light emitting element using triplet exciton energy effectively. Another object is to reduce power consumption of a light emitting element, a light emitting device, and an electronic device. Triplet exciton energy generated in a light emitting layer which exhibits short wavelength fluorescence can be effectively utilized by use of a structure in which the light emitting layers which exhibit short wavelength fluorescence are sandwiched between light emitting layers each including a phosphorescent compound. Further, the emission balance can be improved between the light emitting layer including a phosphorescent compound and the light emitting layer which exhibits fluorescence by the devising of the structure of the light emitting layer which exhibits fluorescence.

39 Claims, 16 Drawing Sheets

U.S. PATENT DOCUMENTS

| | | | |
|---|---|---|---|
| 2002/0113546 A1 | 8/2002 | Seo et al. | |
| 2002/0197511 A1 | 12/2002 | D'Andrade et al. | |
| 2003/0178619 A1 | 9/2003 | Forrest et al. | |
| 2004/0046495 A1 | 3/2004 | Peng | |
| 2004/0232830 A1* | 11/2004 | Hieda | 313/504 |
| 2005/0100760 A1 | 5/2005 | Yokoyama | |
| 2005/0282036 A1 | 12/2005 | D'Andrade et al. | |
| 2006/0263638 A1 | 11/2006 | Kawakami et al. | |
| 2006/0279203 A1* | 12/2006 | Forrest et al. | 313/504 |
| 2007/0202355 A1 | 8/2007 | Kim et al. | |
| 2008/0102310 A1* | 5/2008 | Thompson et al. | 428/690 |
| 2008/0284317 A1* | 11/2008 | Liao et al. | 313/504 |
| 2008/0286607 A1 | 11/2008 | Nomura et al. | |
| 2008/0312437 A1 | 12/2008 | Inoue et al. | |
| 2009/0033212 A1* | 2/2009 | Ahn et al. | 313/504 |
| 2009/0091240 A1 | 4/2009 | Ikeda et al. | |
| 2009/0091255 A1* | 4/2009 | Lee et al. | 313/504 |
| 2010/0051968 A1 | 3/2010 | Seo et al. | |

FOREIGN PATENT DOCUMENTS

| | | |
|---|---|---|
| JP | 8-78163 | 3/1996 |
| JP | 10-264970 | 10/1998 |
| JP | 2001-313180 | 11/2001 |
| JP | 2001-319780 | 11/2001 |
| JP | 2002-164171 | 6/2002 |
| JP | 2002-225949 | 8/2002 |
| JP | 2003-520391 | 7/2003 |
| WO | WO 01/08230 A1 | 2/2001 |
| WO | WO 02/091814 A2 | 11/2002 |

OTHER PUBLICATIONS

O'Brien, D.F. et al, "Improved Energy Transfer in Electrophosphorescent Devices," Applied Physics Letters, vol. 74, No. 3, Jan. 18, 1999, pp. 442-444.

Baldo, M.A. et al, "Very High-Efficiency Green Organic Light-Emitting Devices Based on Electrophosphorescence," Applied Physics Letters, vol. 75, No. 1, Jul. 5, 1999, pp. 4-6.

Sun, Y. et al, "Management of Singlet and Triplet Excitons for Efficient White Organic Light-Emitting Devices," Nature, vol. 440, Apr. 13, 2006, pp. 908-912.

Kondakova, M.E. et al., "17.3: Highly Efficient Fluorescent/Phosphorescent OLED Devices Using Triplet Harvesting," SID DIGEST '08: SID International Symposium Digest of Technical Papers, vol. 39, 2008, pp. 219-222.

* cited by examiner

LIGHT EMITTING ELEMENT, LIGHT EMITTING DEVICE, AND ELECTRONIC DEVICE

BACKGROUND OF THE INVENTION

1. Field of the Invention

The present invention relates to light emitting elements using electroluminescence. In addition, the present invention relates to a light emitting device and an electronic device having the light emitting element.

2. Description of the Related Art

In recent years, research and development has been extensively conducted on light emitting elements using electroluminescence. In a basic structure of these light emitting elements, a substance having a light emitting property is interposed between a pair of electrodes. By application of voltage to these elements, light emission can be obtained from the substance having a light emitting property.

Since such a light emitting element is of self-light emitting type, it is considered that the light emitting element has advantages over a liquid crystal display in that visibility of pixels is high, backlight is not required, and the like and is therefore suitable for a flat panel display element. Another major advantage of such a light emitting element is that it can be manufactured to be thin and lightweight. In addition, extremely high response speed is also a feature.

Since the light emitting element can be formed into a film shape, planar light emission can be easily obtained by forming a large-area element. This is a feature that is hard to be obtained in point sources typified by an incandescent lamp and an LED or linear sources typified by a fluorescent light. Therefore, the light emitting element has a high utility value as a surface light source that can be applied to lighting and the like.

Light emitting elements using electroluminescence are classified broadly according to whether they use an organic compound or an inorganic compound as a substance having a light emitting property.

When an organic compound is used as a substance having a light emitting property, electrons and holes are injected into a layer including an organic compound having a light emitting property from a pair of electrodes by voltage application to a light emitting element, so that current flows therethrough. Then, the carriers (electrons and holes) are recombined, and thus, the organic compound having a light emitting property is excited. The organic compound having a light emitting property returns to a ground state from the excited state, thereby emitting light. Owing to this mechanism, such a light emitting element is referred to as a current-excitation light emitting element.

Note that the excited state generated by an organic compound can be types of a singlet excited state and a triplet excited state, and light emission from the singlet excited state is referred to as fluorescence, and light emission from the triplet excited state is referred to as phosphorescence.

In improving the element characteristics of such a light emitting element, there are many problems caused by the material, and in order to solve such problems, an improvement of the element structure, a development of materials, and the like have been carried out.

For example, in Non-Patent Document 1, a light emitting element with high efficiency is realized by using a method called Triplet Harvesting.

REFERENCE

[Non-Patent Document 1]
M. E. Kondakova, et al., SID 08 DIGEST, pp. 219-222 (2008)

However, as for the structure disclosed in Non-Patent Document 1, a light-emitting layer (Yellow LEL) containing a yellow emissive phosphorescent compound is provided on a cathode side of a light-emitting layer (Blue LEL) containing a blue emissive fluorescent compound. Therefore, a part of the triplet excitation energy of the blue emissive fluorescent compound is transferred to the cathode side, which allows the yellow emissive phosphorescent compound in the Yellow LEL to emit light. On the other hand, since an electron blocking layer (EBL) having greater triplet-excitation energy than that in the Blue LEL is provided on the anode side of the Blue LEL, the transfer of the triplet excitation energy of the blue emissive fluorescent compound to an anode side is impossible. Thus, a part of the triplet excitation energy of the blue emissive fluorescent compound is consumed through the nonradiative process and does not contribute to the light emission.

Thus, it is an object of one embodiment of the present invention to improve luminous efficiency of a light emitting element by using triplet exciton energy more effectively.

In addition, it is another object of one embodiment of the present invention to reduce power consumption of a light emitting element, a light emitting device, and an electronic device.

SUMMARY OF THE INVENTION

The present inventors found that triplet exciton energy generated in a light emitting layer which exhibits short wavelength fluorescence can be effectively utilized by use of a structure in which the light emitting layers which exhibit short wavelength fluorescence are sandwiched between light emitting layers each including a substance which exhibits phosphorescence (hereinafter referred to as a phosphorescent compound). In addition, when light emitting layers which simply exhibit short wavelength fluorescence are sandwiched only by light emitting layers each including a phosphorescent compound, carriers go through the light emitting layer which exhibits fluorescence, and the emission intensity balance collapses. However, they found that the emission intensity balance is improved between the light emitting layer including a phosphorescent compound and the light emitting layer which exhibits fluorescence by the devising of the structure of the light emitting layer which exhibits fluorescence.

Therefore, a light emitting element according one feature of an embodiment of the present invention includes a first layer, a second layer, a third layer, and a fourth layer which are sequentially provided on an anode side between the anode and a cathode; the first layer and the second layer each include a hole transporting property; the third layer and the fourth layer each include an electron transporting property; the first layer includes a first phosphorescent compound and a first organic compound having a hole transporting property; the second layer includes a first fluorescent compound and a second organic compound having a hole transporting property; the third layer includes a second fluorescent compound and a first organic compound having an electron transporting property; and the fourth layer includes a second phosphorescent compound and a second organic compound having an electron transporting property. The triplet excitation energy of the second organic compound having a hole transporting property is higher than or equal to the triplet excitation energy of the first organic compound having a hole transporting property, and the triplet excitation energy of the first organic compound having an electron transporting property is higher than or equal to the triplet excitation energy of the second organic compound having an electron transporting property.

In the above structure, it is preferable that the first organic compound having a hole transporting property and the second organic compound having a hole transporting property be the same organic compound. Since the first organic compound having a hole transporting property and the second organic compound having a hole transporting property are the same organic compound, an energy barrier due to carrier transfer is reduced.

In the above structure, it is preferable that the first organic compound having an electron transporting property and the second organic compound having an electron transporting property be the same organic compound. Since the first organic compound having an electron transporting property and the second organic compound having an electron transporting property are the same organic compound, an energy barrier due to carrier transfer is reduced.

In the above structure, it is preferable that a spacing layer formed using one or both of the first organic compound having a hole transporting property and the second organic compound having a hole transporting property be provided between the first layer and the second layer. In addition, it is preferable that a spacing layer formed using one or both of the first organic compound having an electron transporting property and the second organic compound having an electron transporting property be provided between the third layer and the fourth layer. By provision of the spacing layers, energy transfer from the second layer to the first layer and from the third layer to the fourth layer can be adjusted.

In the above structure, the total thickness of the second layer and the third layer is preferably from 5 nm to 20 nm. When the total thickness of the second layer and the third layer is too large, light emission from the first layer and the fourth layer is reduced, and when the total thickness of the second layer and the third layer is too small, light emission from the second layer and the third layer is reduced. The thickness lies within the range, whereby light emission from each layer of the first layer, the second layer, the third layer, and the fourth layer can be balanced well.

In the above structure, the concentration of the first fluorescent compound in the second layer is preferably from 0.1 wt % to 10 wt %. In addition, the concentration of the second fluorescent compound in the third layer is preferably from 0.1 wt % to 10 wt %. The concentration lies within the range, whereby strong light emission of the second layer or the third layer can be prevented and weak light emission of the first layer or the fourth layer can be prevented, so that light emission from each layer of the first layer, the second layer, the third layer, and the fourth layer can be balanced well.

In the above structure, the first fluorescent organic compound and the second fluorescent organic compound are preferably the same organic compound. When the first fluorescent organic compound and the second fluorescent organic compound are the same organic compound, a light emitting element is easily manufactured.

In the above structure, the emission color of each of the first fluorescent organic compound and the second fluorescent organic compound is preferably blue, and the emission color of the first phosphorescent compound is preferably green and the emission color of the second phosphorescent compound is preferably red. With such a structure, a white light emitting element can be obtained.

In the above structure, the first phosphorescent compound and the second phosphorescent compound are preferably the same organic compound. When the first phosphorescent compound and the second phosphorescent compound are the same organic compound, a light emitting element is easily manufactured.

In the above structure, it is preferable that the first fluorescent organic compound and the second fluorescent organic compound be the same organic compound, the first phosphorescent compound and the second phosphorescent compound be the same organic compound, and the emission color of the first phosphorescent compound and the second phosphorescent compound, the emission color of the first fluorescent compound and the second fluorescent compound be made to be complementary colors. With such a structure, a white light emitting element can be obtained.

Moreover, an embodiment of the present invention includes a light emitting device having the above-described light emitting element. The light emitting device in this specification includes an image display device, a light emitting device, or a light source (including a lighting device). Further, the following are all included in a light emitting device: a module in which a connector, for example, a flexible printed circuit (FPC), a tape automated bonding (TAB) tape, or a tape carrier package (TCP) is attached to a panel provided with a light emitting element; a module provided with a printed wiring board at the end of the TAB tape or the TCP; and a module in which an integrated circuit (IC) is directly mounted to a light emitting element by a chip on glass (COG) method.

Further, an electronic device using the light emitting element according to an embodiment of the present invention in a display portion is also included in the scope of the present invention. Consequently, one feature of an electronic device according to an embodiment of the present invention is to include a display portion, in which the display portion is provided with the above-described light emitting element and a control means to control light emission of the light emitting element.

By application of an embodiment of the present invention, the singlet exciton and the triplet exciton which are generated in the light emitting layer can be effectively used, and a light emitting element with high luminous efficiency can be realized.

In addition, by application of an embodiment of the present invention, power consumption of a light emitting element, a light emitting device, and an electronic device can be reduced.

DETAILED DESCRIPTION OF THE INVENTION

Figure 1:
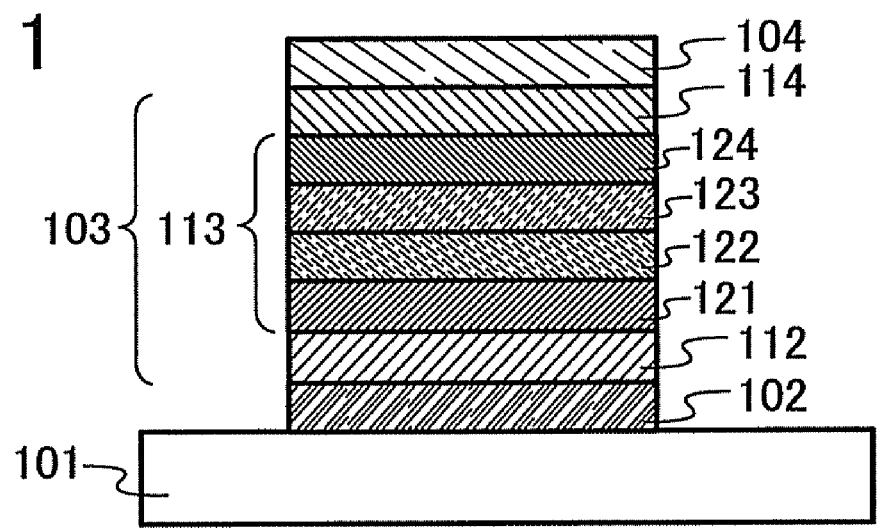
FIG. 1 illustrates a light emitting element according to an embodiment of the present invention.

Hereinafter, embodiments of the present invention will be described in detail with reference to the accompanying drawings. However, embodiment of the present invention is not limited to the following description, and various changes and modifications for the modes and details thereof will be apparent to those skilled in the art unless such changes and modifications depart from the spirit and scope of the present invention. Therefore, the present invention should not be interpreted as being limited to what is described in the embodiments described below. Note that like portions or portions having a similar function are denoted by the same reference numerals through drawings, and therefore, description thereof is omitted.

Embodiment 1

A mode of a light emitting element according to an embodiment of the present invention is described with reference to FIGS. 1, 2, 3, and 4.

The light emitting element according to an embodiment of the present invention has a plurality of layers between a pair of electrodes. In this specification, the plurality of layers formed between the pair of electrodes is collectively referred to as an EL layer. The EL layer has at least a light emitting layer.

In this embodiment, the light emitting element includes a first electrode 102, a second electrode 104, and an EL layer 103 formed between the first electrode 102 and the second electrode 104, as illustrated in FIG. 1. Note that in this embodiment, the first electrode 102 serves as an anode and the second electrode 104 serves as a cathode. In other words, when voltage is applied to the first electrode 102 and the second electrode 104 such that potential of the first electrode 102 is higher than that of the second electrode 104, light emission can be obtained. Such a case is described below.

A substrate 101 is used as a support of the light emitting element. The substrate 101 can be formed with, for example, glass, plastic, or the like. Note that materials other than glass or plastic can be used as long as they can function as a support of the light emitting element.

The first electrode 102 is preferably formed using a metal, an alloy, an electrically conductive compound, a mixture of these, or the like each having a high work function (specifically, a work function of 4.0 eV or higher is preferable). Specifically, indium tin oxide (ITO), indium tin oxide including silicon or silicon oxide, indium zinc oxide (IZO), indium oxide including tungsten oxide and zinc oxide (IWZO), or the like can be used. These conductive metal oxide films are generally formed by sputtering; however, the films may be manufactured by applying a sol-gel method. For example, indium zinc oxide (IZO) can be formed by a sputtering method using indium oxide into which 1 wt % to 20 wt % of zinc oxide is added, as a target. Indium oxide including tungsten oxide and zinc oxide (IWZO) can be formed by a sputtering method using a target in which 0.5 wt % to 5 wt % of tungsten oxide and 0.1 wt % to 1 wt % of zinc oxide are mixed with indium oxide. In addition, gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride), and the like can be given.

The second electrode 104 can be formed using a metal, an alloy, an electrically conductive compound, a mixture of these, or the like each having a low work function (specifically, a work function of 3.8 eV or lower is preferable). As a specific example of such a cathode material, an element belonging to Group 1 or Group 2 in the periodic table, that is, an alkali metal such as lithium (Li) or cesium (Cs); an alkaline earth metal such as magnesium (Mg), calcium (Ca), or strontium (Sr); an alloy including any of these (MgAg, AlLi); a rare-earth metal such as europium (Eu) or ytterbium (Yb); an alloy of these; and the like can be given. However, when an electron injecting layer is provided between the second electrode 104 and an electron transporting layer, the second electrode 104 can be formed using various conductive materials such as Al, Ag, ITO, or indium tin oxide including silicon or silicon oxide regardless of its work function.

There is no particular limitation on the stacked structure of the EL layer 103, and layers formed with substances having a high electron transporting property, a substance having a high hole transporting property, a substance having a high electron injecting property, a substance having a high hole injecting property, a bipolar substance (a substance having high electron transporting and hole transporting properties) and/or the like may be combined with the light emitting layer described in this embodiment, as appropriate. For example, a hole injecting layer, a hole transporting layer, a hole blocking layer, an electron transporting layer, an electron injecting layer, and the like may be combined as appropriate with the light emitting layer described in Embodiment 1. Specific materials to form each of the layers are given below. FIG. 1 illustrates a structure in which the first electrode 102, a hole transporting layer 112, a light emitting layer 113, an electron transporting layer 114, and the second electrode 104 are sequentially stacked, as an example.

The hole transporting layer 112 is a layer including a substance having a high hole transporting property. As examples of the substance having a high hole transporting property, there are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB), and the like. The substances described here are mainly substances having a hole mobility of $10^{-6}$ cm$^2$/Vs or more. Note that any other substance having a hole transporting property which is higher than an electron transporting property may be used. Note that the layer including a substance having a high hole transporting property is not limited to a single layer, and two or more layers including the above-described substances may be stacked.

Furthermore, for the hole transporting layer 112, a high molecular compound can be used. Examples of high molecular compounds include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N-bis(4-butylphenyl)-N,N'-bis(phenyl)benzidine (abbreviation: Poly-TPD), and the like.

The light emitting layer 113 is a layer including a substance having a high light emitting property. In the light emitting element according to an embodiment of the present invention, the light emitting layer 113 includes a first layer 121, a second layer 122, a third layer 123, and a fourth layer 124 which are sequentially provided from the side of the first electrode 102 that functions as an anode.

The first layer 121 has a hole transporting property and includes a first substance which exhibits phosphorescence (hereinafter referred to as a phosphorescent compound) and a first organic compound having a hole transporting property. The triplet excitation energy of the first phosphorescent compound is the same as or lower than the triplet excitation energy of the first organic compound having a hole transporting property.

The second layer 122 has a hole transporting property and includes a first substance which exhibits fluorescence (hereinafter referred to as a fluorescent compound) and a second organic compound having a hole transporting property. The singlet excitation energy of the first fluorescent compound is the same as or lower than the singlet excitation energy of the second organic compound having a hole transporting property.

The third layer 123 has an electron transporting property and includes a second fluorescent compound and a first organic compound having an electron transporting property. The singlet excitation energy of the second fluorescent compound is the same as or lower than the singlet excitation energy of the first organic compound having an electron transporting property.

The fourth layer 124 has an electron transporting property and includes a second phosphorescent compound and a second organic compound having an electron transporting property. The triplet excitation energy of the second phosphorescent compound is the same as or lower than the triplet excitation energy of the second organic compound having an electron transporting property.

With such a structure, when voltage is applied to the first electrode 102 and the second electrode 104 such that the potential of the first electrode 102 is higher than that of the second electrode 104, a recombination region is formed in the vicinity of the interface between the second layer 122 and the third layer 123.

Figure 2:
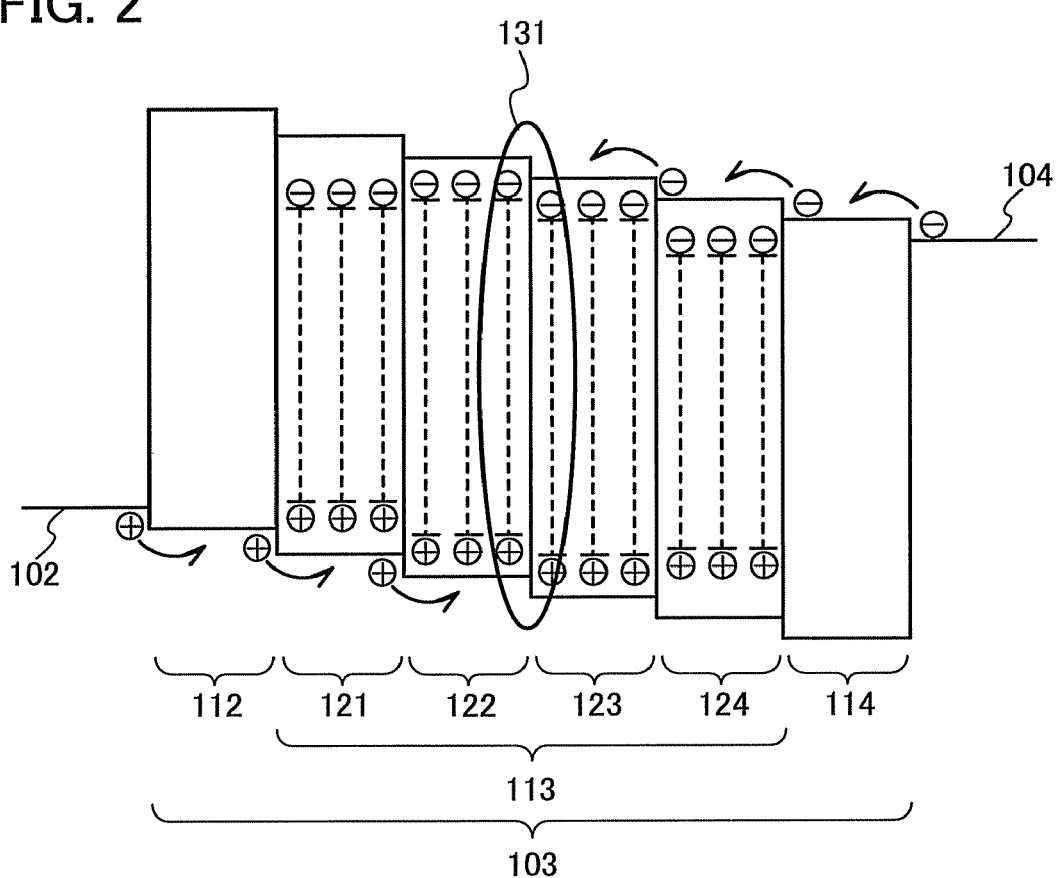
FIG. 2 is a band diagram illustrating a light emitting element according to an embodiment of the present invention.

In other words, as illustrated in FIG. 2, holes injected from the first electrode 102 are transported through the hole transporting layer 112 to the first layer 121. Because the first layer 121 has a hole transporting property, the holes are transported through the first layer 121 to the second layer 122. Because the second layer 122 also has a hole transporting property, the holes are transported to the vicinity of the interface between the second layer 122 and the third layer 123. On the other hand, electrons injected from the second electrode 104 are transported through the electron transporting layer 114 to the fourth layer 124. Because the fourth layer 124 has an electron transporting property, the electrons are transported through the fourth layer 124 to the third layer 123. Because the third layer 123 also has an electron transporting property, the electrons are transported to the vicinity of the interface between the third layer 123 and the second layer 122. Then, in the vicinity of the interface between the second layer 122 and the third layer 123, the holes and the electrons are recombined. In this recombination region 131, an exciton of a singlet excited state (S*) and an exciton of a triplet excited state (T*) are generated, and the statistical generation ratio is thought to be S*:T*=1:3. The energy of the exciton of a singlet excited state is transferred to a singlet excited state of the first fluorescent compound included in the second layer 122 and a singlet excited state of the second fluorescent compound included in the third layer 123, whereby the first fluorescent compound and the second fluorescent compound emit light.

On the other hand, in a conventional light emitting element, an exciton of a triplet excited state generated in the recombination region 131 is deactivated without contribution to light emission, or only a part is used as disclosed in Non-Patent Document 1.

In the light emitting element according to an embodiment of the present invention, the triplet excitation energy (an energy difference between a ground state and a triplet excited state) of the second organic compound having a hole transporting property is the same as or higher than the triplet excitation energy of the first organic compound having a hole transporting property. The triplet excitation energy of the first organic compound having an electron transporting property is the same as or higher than the triplet excitation energy of the second organic compound having an electron transporting property. With such a structure, exciton energy of a triplet excited state generated in the recombination region 131 can be transferred through the second layer to the first layer 121, and the energy of the exciton can be transferred to the triplet excited state of the first organic compound having a hole transporting property included in the first layer 121. In addition, exciton energy of a triplet excited state generated in the recombination region 131 can be transferred through the third layer to the fourth layer 124, and the energy of the exciton can be transferred to a triplet excited state of a second organic compound having an electron transporting property included in the fourth layer 124.

As a result, energy is transferred from the triplet excited state of the first organic compound having a hole transporting property to the triplet excited state of the first phosphorescent compound, whereby the first phosphorescent compound emits light. In addition, energy is transferred from the triplet excited state of the second organic compound having an electron transporting property to the triplet excited state of the second phosphorescent compound, whereby the second phosphorescent compound emits light.

In other words, by application of an embodiment of the present invention, the exciton of the singlet excited state and the exciton of the triplet excited state which are generated in the recombination region 131 can be effectively used for light emission.

As for the light emitting element according to an embodiment of the present invention, the above-mentioned structure of the light emitting layer 113 is adopted, whereby the recombination region 131 can be limited to the vicinity of the center of the light emitting layer 113, and carrier penetration can be suppressed, so that the emission intensity balance can be improved. In addition, the thickness of each layer (the first layer 121, the second layer 122, the third layer 123, and the fourth layer 124) is adjusted, whereby the distance from the recombination region 131 to each layer can be adjusted; therefore, the emission balance can be improved.

In the above structure, it is preferable that the first organic compound having a hole transporting property included in the first layer 121 and the second organic compound having a hole transporting property included in the second layer 122 be the same organic compound. By use of the same organic compound, the excitons of the triplet excited state generated in the recombination region 131 are easily diffused, and the energy is more smoothly transferred to the triplet excited state of the first organic compound having a hole transporting property included in the first layer 121. In addition, manufacture of a light emitting element also becomes easy.

In a similar manner, it is preferable that the first organic compound having an electron transporting property included in the third layer 123 and the second organic compound having an electron transporting property included in the fourth layer 124 be the same organic compound. By use of the same organic compound, the excitons of the triplet excited state generated in the recombination region 131 are easily diffused, and the energy is more smoothly transferred to the triplet excited state of the second organic compound having an electron transporting property included in the fourth layer 124. In addition, manufacture of a light emitting element also becomes easy.

Figure 3:
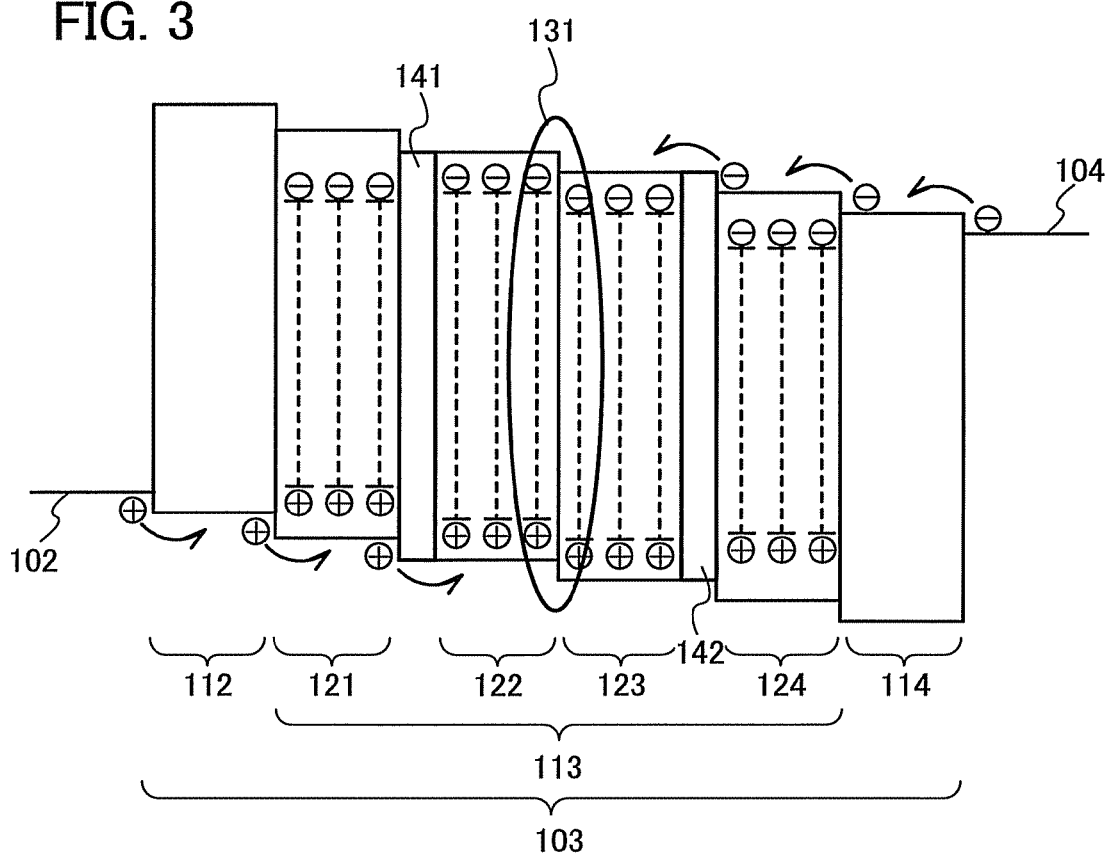
FIG. 3 is a band diagram illustrating a light emitting element according to an embodiment of the present invention.

As illustrated in FIG. 3, it is preferable that a spacing layer 141 formed using one or both of the first organic compound having a hole transporting property and the second organic compound having a hole transporting property be provided between the first layer 121 and the second layer 122. In FIG. 3, the spacing layer 141 formed using the second organic compound having a hole transporting property is illustrated as an example. By provision of the spacing layer 141, the distance between the recombination region 131 and the first layer 121 is easily adjusted, whereby light emission intensity from the first layer 121 is easily adjusted in accordance with the transfer of the energy from the triplet excited state. In addition, the singlet excitation energy of the first fluorescent compound included in the second layer 122 can be prevented from transferring to the first phosphorescent compound included in the first layer 121 due to the energy transfer by the Förster mechanism. Further, one or both of the first organic compound having a hole transporting property and the second organic compound having a hole transporting property is used for the spacing layer 141, whereby the energy from the triplet excited state can be smoothly transferred. In addition, the spacing layer can be easily formed.

In a similar manner, it is preferable that a spacing layer formed using one or both of the first organic compound having an electron transporting property and the second organic compound having an electron transporting property be provided between the third layer 123 and the fourth layer 124. In FIG. 3, a spacing layer 142 formed using the first organic compound having an electron transporting property is illustrated as an example. By provision of the spacing layer, the distance between the recombination region 131 and the fourth layer 124 is easily adjusted, whereby light emission intensity from the fourth layer 124 is easily adjusted in accordance with the transfer of the energy from the triplet excited state. In addition, the singlet excitation energy of the second fluorescent compound included in the third layer 123 can be prevented from transferring to the second phosphorescent compound included in the fourth layer 124 due to the energy transfer by the Förster mechanism. Further, one or both of the first organic compound having an electron transporting property and the second organic compound having an electron transporting property is used for the spacing layer, whereby the energy from the triplet excited state can be smoothly transferred. In addition, a spacing layer can be easily formed.

Further, the total thickness of the second layer 122 and the third layer 123 is preferably greater than or equal to 5 nm and less than or equal to 20 nm. When the total thickness of the second layer 122 and the third layer 123 is too small, carriers penetrate, and the recombination region expands. When the total thickness of the second layer 122 and the third layer 123 is too large, the triplet excitation energy from the recombination region is not transferred to the first layer 121 and the fourth layer 124, so that the first phosphorescent compound and the second phosphorescent compound do not emit light. Therefore, the total thickness of the second layer 122 and the third layer 123 is preferably greater than or equal to 5 nm and less than or equal to 20 nm.

In addition, the concentration of the first fluorescent organic compound in the second layer 122 is preferably greater than or equal to 0.1 wt % and less than or equal to 10 wt %. When the concentration of the first fluorescent organic compound is too low, light emission from the first fluorescent organic compound is reduced. Further, when the concentration of the first fluorescent organic compound is too high, the energy from the triplet excitation energy from the recombination region is received by the first fluorescent organic compound, thereby deactivating excitons without light emission. Therefore, the concentration of the first fluorescent organic compound in the second layer 122 is preferably greater than or equal to 0.1 wt % and less than or equal to 10 wt %.

In a similar manner, the concentration of the second fluorescent organic compound in the third layer 123 is preferably greater than or equal to 0.1 wt % and less than or equal to 10 wt %. When the concentration of the second fluorescent organic compound is too low, light emission from the second fluorescent organic compound is reduced. In addition, when the concentration of the second fluorescent organic compound is too high, the energy from the triplet excitation energy from the recombination region is received by the second fluorescent organic compound, thereby deactivating excitons without light emission. Therefore, the concentration of the second fluorescent organic compound in the third layer 123 is preferably greater than or equal to 0.1 wt % and less than or equal to 10 wt %.

It is preferable that the first fluorescent organic compound included in the second layer 122 and the second fluorescent organic compound included in the third layer 123 be the same organic compound. By use of the same organic compound, the energy of the exciton generated from the recombination region 131 is more equally transferred to the second layer 122 and the third layer 123. Therefore, the emission balance can be improved. In addition, manufacture of a light emitting element also becomes easy.

Since light emission can be obtained from a plurality of substances each having a high light emitting property, the light emitting element according to an embodiment of the present invention is suitable for a white light emitting element. The light emitting element according to an embodiment of the present invention is applied to the white light emitting element, whereby a white light emitting element with high efficiency can be obtained.

For example, the emission color of the first fluorescent organic compound and the emission color of the first phosphorescent compound are made to be complementary colors, whereby a white light emitting element can be obtained. In addition, the emission color of the second fluorescent organic compound and the emission color of the second phosphorescent compound are made to be complementary colors, whereby a white light emitting element with an excellent color rendering property can be obtained.

Note that "complementary color" means a relation between colors which becomes an achromatic color when they are mixed. That is, white light emission can be obtained by mixture of light from substances whose emission colors are complementary colors.

In addition, for example, the emission color of the first fluorescent organic compound and the emission color of the second phosphorescent compound are made to be complementary colors, whereby a white light emitting element can be obtained. Further, the emission color of the second fluorescent organic compound and the emission color of the first phosphorescent compound are made to be complementary colors, whereby a white light emitting element with an excellent color rendering property can be obtained.

The emission color of the first fluorescent organic compound and that of the second fluorescent organic compound are blue, and the emission color of the first phosphorescent compound is green and the emission color of the second phosphorescent compound is red, whereby a white light emitting element with an excellent color rendering property can be obtained.

When the first fluorescent organic compound and the second fluorescent organic compound are the same organic compound, and the first phosphorescent compound and the second phosphorescent compound are the same organic compound, the emission color of the first phosphorescent compound and the second phosphorescent compound and the emission color of the first fluorescent organic compound and the second fluorescent organic compound are made to be complementary colors, whereby a white light emitting element can be obtained. Since the first fluorescent organic compound and the second fluorescent organic compound are the same organic compound, the energy from the recombination region to the second layer 122 and the third layer 123 is more equally transferred, whereby the emission balance can be improved. In addition, manufacture of a light emitting element also becomes easy. Further, when the first phosphorescent compound and the second phosphorescent compound are the same organic compound, a white light emitting element can be more easily formed.

Various kinds of materials can be used for the phosphorescent compounds of the second layer 122 and the third layer 123. For example, as a blue light emitting phosphorescent compound, organometallic complexes such as bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis[2-(3',5'bistrifluoromethylphenyl)pyridinato-N,$C^{2'}$]iridium(III)picolinate (abbreviation: Ir(CF$_3$ppy)$_2$(pic)), and bis[2-(4',6'-difluorophenyl)pyridinato-N,$C^{2'}$]iridium(III)acetylacetonate (abbreviation: FIr(acac)) can be given. As a green light emitting phosphorescent compound, organometallic complexes such as tris(2-phenylpyridinato-N,$C^{2'}$)iridium(III) (abbreviation: Ir(ppy)$_3$), bis(2-phenylpyridinato-N,$C^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), and bis(benzo[h]quinolinato)iridium(III) acetylacetonate (abbreviation: Ir(bzq)$_2$(acac)), can be given. As a yellow light emitting phosphorescent compound, organometallic complexes such as bis(2,4-diphenyl-1,3-oxazolato-N,$C^{2'}$)iridium(III)acetylacetonate (abbreviation: Ir(dpo)$_2$(acac)), bis[2-(4'-(perfluorophenylphenyl)pyridinato]iridium(III) acetylacetonate (abbreviation: Ir(p-PF-ph)$_2$ (acac)), and bis(2-phenylbenzothiazolato-N,$C^{2'}$)iridium(III) acetylacetonate (abbreviation: Ir(bt)$_2$(acac)) can be given. As an orange light emitting phosphorescent compound, organometallic complexes such as tris(2-phenylquinolinato-N,$C^2$) iridium(III) (abbreviation: Ir(pq)$_3$), bis(2-phenylquinolinato-N,$C^2$)iridium(III)acetylacetonate (abbreviation: Ir(pq)$_2$ (acac)), and (acetylacetonato)bis(3,5-dimethyl-2-phenylpyrazinato)iridium(III) (abbreviation: [Ir(mppr-Me)$_2$ (acac)] can be given. As a red light emitting phosphorescent compound, organometallic complexes such as bis[2-(2'-benzo[4,5-a]thienyl)pyridinato-N,$C^{3'}$)iridium(III) acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl) quinoxalinato]iridium(III) (abbreviation: Ir(Fdpq)$_2$(acac)), and 2,3,7,8,12,13,17,18-octaethyl-21H,23H-porphyrinplatinum(II) (abbreviation: PtOEP) can be given. In addition, a rare-earth metal complex such as tris(acetylacetonato) (monophenanthroline)terbium(II) (abbreviation: Tb(acac)$_3$ (Phen)); tris(1,3-diphenyl-1,3-propanedionato) (monophenanthroline)europium(III) (abbreviation: Eu(DBM)$_3$(Phen)); or tris[1-(2-thenoyl)-3,3,3-trifluoroacetonato](monophenanthroline)europium(III) (abbreviation: Eu(TTA)$_3$(Phen)) performs light emission (electron transition between different multiplicities) from a rare-earth metal ion; therefore, such a rare-earth metal complex can be used as the phosphorescent compound.

Various kinds of materials can be used for the fluorescent compounds of the first layer 121 and the fourth layer 124. For example, as a blue light emitting fluorescent compound, there are N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 2,5,8,11-tetra(tert-butyl)perylene (abbreviation: TBP), and the like. As a green light emitting fluorescent compound, there are N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. As a yellow light emitting fluorescent compound, there are rubrene, 5,12-bis(1,1'-biphenyl-4-yl)-6,11-diphenyltetracene (abbreviation: BPT), and the like. As a red light emitting fluorescent compound, there are N,N,N',N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-a] fluoranthene-3,10-diamine (abbreviation: p-mPhAFD), and the like.

Various kinds of materials can be used for the organic compound having a hole transporting property in each of the first layer 121 and the second layer 122. For example, an aromatic amine compound such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4, 4'-diamine (abbreviation: TPD), 4,4',4''-tris(carbazol-9-yl) triphenylamine (abbreviation: TCTA), 4,4',4''-tris(N,N'-diphenylamino)triphenylamine (abbreviation: TDATA), 4,4', 4''-tris[N-(3-methylphenyl)-N-phenylamino]triphenylamine (abbreviation: MTDATA), or 4,4'-bis[N-(spiro-9,9'-bifluoren-2-yl)-N-phenylamino]biphenyl (abbreviation: BSPB), or the like can be used. The substances described here are mainly substances having a hole mobility of $10^{-6}$ cm$^2$/Vs or more. Note that any other substance having a hole transporting property which is higher than an electron transporting property may be used. A high molecular compound such as poly (N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA); or poly[N,N'-bis (4-butylphenyl)-N,N'-bis(phenyl)benzidine] (abbreviation: Poly-TPD) can be used.

Various kinds of materials can be used for the organic compound having an electron transporting property in each of the third layer 123 and the fourth layer 124. For example, a metal complex having a quinoline or benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$), or the like can be used. Further alternatively, besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), bathophenanthroline (abbreviation: BPhen), bathocuproine (abbreviation: BCP), or the like can be used. The substances described here are mainly substances having an electron mobility of $10^{-6}$ cm$^2$/Vs or more. Note that any other substance having an electron transporting property which is higher than a hole transporting property may be used. Alternatively, a high molecular compound such as poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-pyridine-6,6'-diyl)] (abbreviation: PF-BPy) can be used.

A white light emitting element to which an embodiment of the present invention is applied can be obtained by using the following example. As the first phosphorescent compound in the first layer, (acetylacetonato)bis[2,3-bis(4-fluorophenyl)quinoxalinato]iridium(III) (abbreviation: Ir(Fdpq)$_2$(acac)) which emits red light is used. As the first organic compound having a hole transporting property, 4,4',4''-tris(carbazol-9-yl)triphenylamine (abbreviation: TCTA) is used. As the first fluorescent compound in the second layer, 2,5,8,11-tetra(tert-butyl)perylene (abbreviation: TBP) which emits blue light is used. As the second compound having a hole transporting property, TCTA which is the same as that used for the first compound having a hole transporting property is used. As the second fluorescent compound in the third layer, TBP which is the same as that used for the first fluorescent compound is used. As the first organic compound having an electron transporting property, 9-[4-(5-phenyl-1,3,4-oxadiazol-2-yl)phenyl]carbazole (abbreviation: CO11) is used. As the second phosphorescent compound in the fourth layer, bis(2-phenylpyridinato-N,C$^{2'}$)iridium(III)acetylacetonate (abbreviation: Ir(ppy)$_2$(acac)) which emits green light is used. As the second organic compound having an electron transporting property, CO11 which is the same as that used for the first organic compound having an electron transporting property is used.

The electron transporting layer 114 is a layer including a substance having a high electron transporting property. For example, a metal complex having a quinoline or benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato) beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$), or the like can be used. Further alternatively, besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-biphenylyl)-1,2,4-triazole (abbreviation: TAZ), bathophenanthroline (abbreviation: BPhen), bathocuproine (abbreviation: BCP), or the like can be used. The substances described here are mainly substances having an electron mobility of $10^{-6}$ cm$^2$/Vs or more. Note that any other substance having an electron transporting property which is higher than a hole transporting property may be used. Furthermore, the electron transporting layer is not limited to a single layer, and two or more layers made of the above-described substances may be stacked.

Alternatively, as the electron transporting layer 114, a high molecular compound such as poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-pyridine-6,6'-diyl)] (abbreviation: PF-BPy) can be used.

Figure 4:
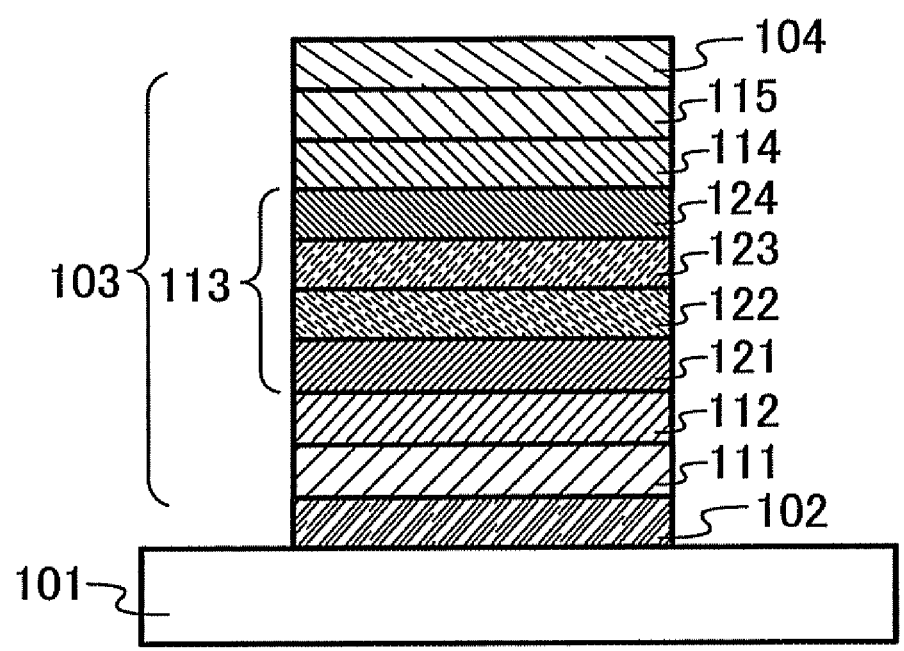
FIG. 4 illustrates a light emitting element according to an embodiment of the present invention.

As illustrated in FIG. 4, a hole injecting layer 111 may be provided between the first electrode 102 and the hole transporting layer 112. As the substance having a high hole injecting property, molybdenum oxide, vanadium oxide, ruthenium oxide, tungsten oxide, manganese oxide, or the like can be used. In addition, it is possible to use a phthalocyanine-based compound such as phthalocyanine (abbreviation: H$_2$Pc) or copper phthalocyanine (abbreviation: CuPc), a high molecule such as poly(3,4-ethylenedioxythiophene)/poly(styrenesulfonic acid) (PEDOT/PSS), or the like to form the hole injecting layer.

Alternatively, a composite material in which an acceptor substance is included in a substance having a high hole transporting property can be used for the hole injecting layer 111. Note that, by using the substance in which an acceptor substance is included in a substance having a high hole transporting property, a material used to form an electrode can be selected regardless of its work function. In other words, besides a material with a high work function, a material with a low work function can also be used as the first electrode 102. As the acceptor substance, 7,7,8,8-tetracyano-2,3,5,6-tetrafluoroquinodimethane (abbreviation: F$_4$-TCNQ), chloranil, and the like can be given. In addition, transition metal oxide can be given. Further, oxide of metals that belong to Group 4 to Group 8 in the periodic table can be given. Specifically, vanadium oxide, niobium oxide, tantalum oxide, chromium oxide, molybdenum oxide, tungsten oxide, manganese oxide, and rhenium oxide are preferable because of a high electron accepting property. Among these, molybdenum oxide is especially preferable since it is stable in the air and its hygroscopic property is low so that it can be easily treated.

Note that, in this specification, "composition" means not only a simple mixture of two materials but also a mixture of a plurality of materials in a condition where electric charge is given and received among the materials.

As the organic compound used for the composite material, various compounds such as an aromatic amine compound, a carbazole derivative, aromatic hydrocarbon, and a high molecular compound (oligomer, dendrimer, polymer, or the like) can be used. Note that the organic compound used for the composite material is preferably an organic compound having a high hole transporting property. Specifically, a substance having a hole mobility of $10^{-6}$ cm$^2$/Vs or more is preferably used. Note that any other substance having a hole transporting property which is higher than an electron transporting property may be used. The organic compound that can be used for the composite material is specifically given below.

For example, the followings can be given as the aromatic amine compound: N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis[N-(3-methylphenyl)-N-phenylamino]biphenyl (abbreviation: DNTPD); 1,3,5-tris[N-(4-diphenylaminophenyl)-N-phenylamino]benzene (abbreviation: DPA3B); and the like.

As specific examples of the carbazole derivative which can be used as the composite material, the following can be given: 3-[N-(9-phenylcarbazol-3-yl)-N-phenylamino]-9-phenyl-carbazole (abbreviation: PCzPCA1); 3,6-bis[N-(9-phenyl-carbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Moreover, as carbazole derivatives which can be used for the composite material, 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthracenyl)phenyl]-9H-carbazole (abbreviation: CzPA); 1,4-bis[4-(N-carbazolyl)phenyl]-2,3,5,6-tetraphenylbenzene; or the like can also be used.

As aromatic hydrocarbon which can be used for the composite material, the following can be given for example: 2-tert-butyl-9,10-di(2-naphthyl)anthracene (abbreviation: t-BuDNA); 2-tert-butyl-9,10-di(1-naphthyl)anthracene, 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. In addition, pentacene, coronene, or the like can also be used. As these aromatic hydrocarbons listed here, an aromatic hydrocarbon having a hole mobility of $1\times10^{-6}$ cm$^2$/Vs or more and having 14 to 42 carbon atoms is more preferable.

Note that aromatic hydrocarbon that can be used for the composite material may have a vinyl skeleton. As an aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like can be given.

In addition, a high molecular compound such as poly(N-vinylcarbazole) (abbreviation: PVK) or poly(4-vinyl triphenylamine) (abbreviation: PVTPA) can also be used.

As illustrated in FIG. 4, an electron injecting layer 115 may be provided between the electron transporting layer 114 and the second electrode 104. As the electron injecting layer 115, an alkali metal, an alkaline earth metal, or a compound of these such as lithium fluoride (LiF), cesium fluoride (CsF), or calcium fluoride (CaF$_2$) can be used. For example, a layer formed using a substance having an electron transporting property including an alkali metal, an alkaline earth metal, or a compound of these, such as Alq which includes magnesium (Mg), can be used. When a layer formed using a substance having an electron transporting property including an alkali metal or an alkaline earth metal is used as the electron injecting layer 115, electrons can be efficiently injected from the second electrode 104, which is preferable.

As a formation method of the EL layer 103, various methods can be employed, and either a wet process or a dry process can be used. For example, a vacuum evaporation method, an inkjet method, a spin coating method, or the like may be used. Further, each electrode or each layer may be formed by a different method.

In the light emitting element according to an embodiment of the present invention having the above structure, to allow current to flow due to a potential difference between the first electrode 102 and the second electrode 104 and holes and electrons are recombined in the EL layer 103 so that light is emitted. More specifically, a light emitting region is formed in the light emitting layer 113 in the EL layer 103.

Figure 5A:
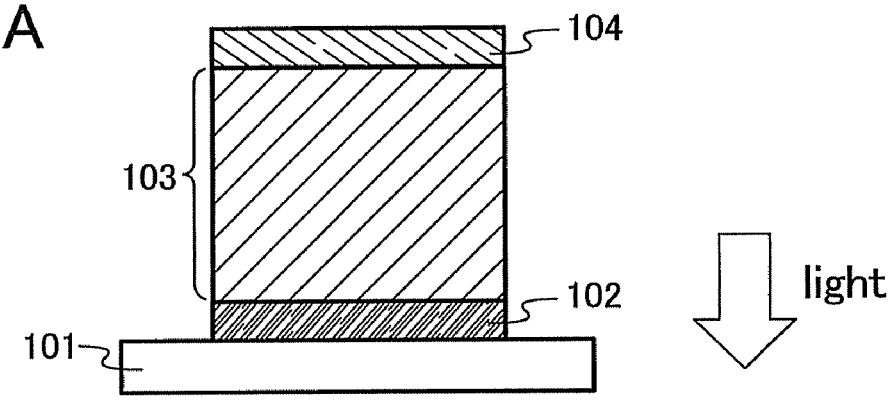
FIGS. 5A to 5C illustrate a light emitting element according to an embodiment of the present invention.
Figure 5B:
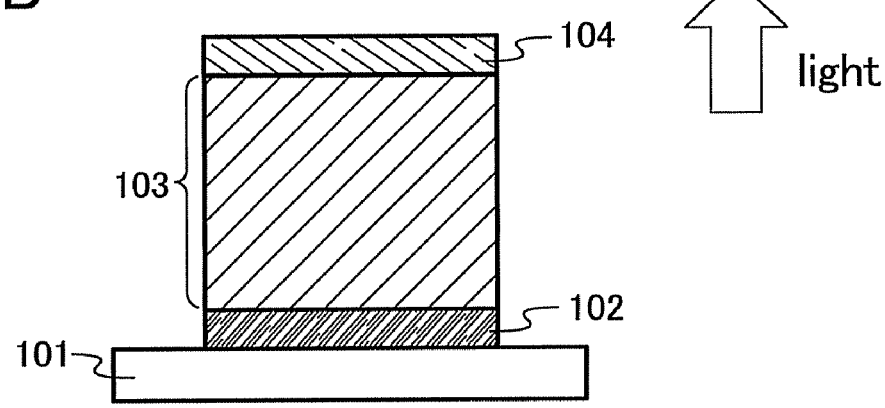
Figure 5C:
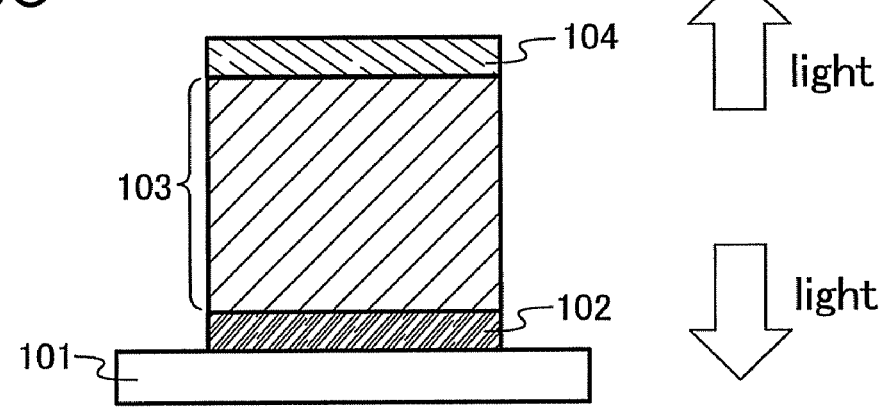

The emitted light is extracted out through one or both of the first electrode 102 and the second electrode 104. Accordingly, one or both of the first electrode 102 and the second electrode 104 is/are an electrode having a light transmitting property. When only the first electrode 102 is an electrode having a light transmitting property, light is extracted from the substrate side through the first electrode 102 as illustrated by an arrow in FIG. 5A. In addition, when only the second electrode 104 is an electrode having a light transmitting property, light is extracted from the opposite side to the substrate side through the second electrode 104 as illustrated by an arrow in FIG. 5B. Further, when the first electrode 102 and the second electrode 104 are both electrodes having light transmitting properties, light is extracted to opposite sides, i.e., the substrate side and the opposite side, through the first electrode 102 and the second electrode 104 as illustrated by an arrow in FIG. 5C.

The structure of EL layer 103 provided between the first electrode 102 and the second electrode 104 is not limited to the above example. A structure other than the above-described one may also be used as long as a light emitting region in which holes and electrons are recombined is provided in a portion apart from the first electrode 102 and the second electrode 104 so that quenching caused by the light emitting region and the first electrode 102 or the second electrode 104 coming close to each other is suppressed, and moreover, as long as the light emitting layer 113 includes the above structure.

In other words, there are no particular limitations on the stacked structure of the EL layer 103, and layers formed using a substance having a high electron transporting property, a substance having a high hole transporting property, a substance having a high electron injecting property, a substance having a high hole injecting property, a bipolar substance (a substance having high electron transporting and hole transporting properties), a hole block material, and the like may be freely combined with the light emitting layer 113 of an embodiment of the present invention.

Figure 6:
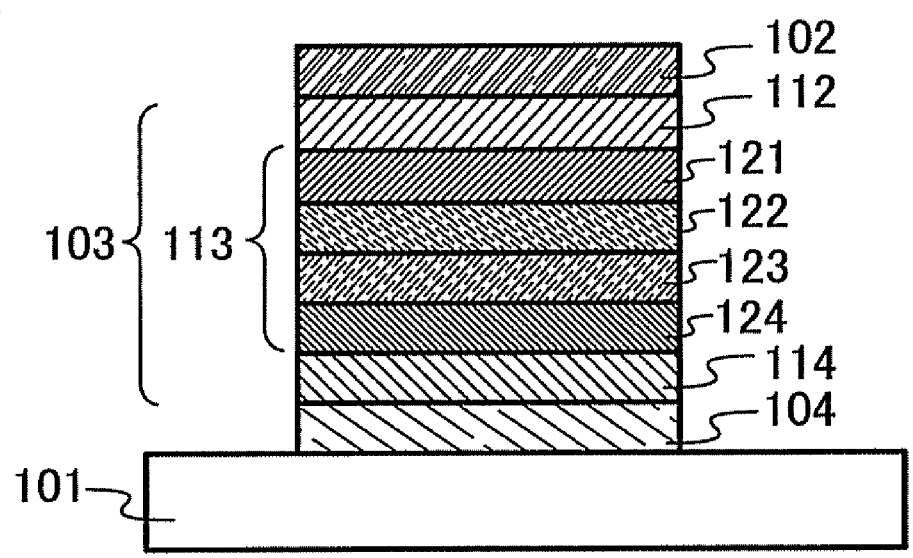
FIG. 6 illustrates a light emitting element according to an embodiment of the present invention.

The light emitting element illustrated in FIG. 6 has a structure in which the second electrode 104 functioning as the cathode, the EL layer 103, and the first electrode 102 functioning as the anode are sequentially stacked over the substrate 101. The EL layer 103 has the hole transporting layer 112, the light emitting layer 113, and the electron transporting layer 114. In the light emitting layer 113, the first layer 121, the second layer 122, the third layer 123, and the fourth layer 124 are sequentially stacked from the first electrode 102 side.

In this embodiment, the light emitting element is manufactured over a substrate formed with glass, plastic, or the like. By formation of a plurality of such light emitting elements over a substrate, a passive matrix light emitting device can be manufactured. Alternatively, for example, a thin film transistor (TFT) may be formed over a substrate formed with glass, plastic, or the like, and a light emitting element may be manufactured over an electrode that is electrically connected to the TFT. Thus, an active matrix light emitting device which controls the driving of a light emitting element by a TFT can be manufactured. Note that a structure of the TFT is not particularly limited. The TFT may be either of staggered type or inverted staggered type. As for a driver circuit formed on the TFT substrate also, one or both of n-channel transistors and p-channel transistors may be used. In addition, the crystallinity of a semiconductor film used for the TFT is not particularly limited. Either an amorphous semiconductor film or a crystalline semiconductor film may be used.

The light emitting element according to an embodiment of the present invention can achieve high luminous efficiency by efficiently using an exciton of a singlet excited state and an exciton of a triplet excited state which are generated in the recombination region.

Since high luminous efficiency is obtained, power consumption of the light emitting element can be reduced.

Note that this embodiment can be combined with any of other embodiments, as appropriate.

Embodiment 2

In this embodiment, a light emitting element (a stacked type element) in which a plurality of light emitting units according to an embodiment of the present invention is stacked will be described with reference to FIG. 7. This light emitting element is a light emitting element having a plurality of light emitting units between a first electrode and a second electrode. As the light emitting units, at least a light emitting layer may be included, and a structure similar to that of the EL layer described in Embodiment 1 can be used. In other words, the light emitting element described in Embodiment 1 is a light emitting element having one light emitting unit, and a light emitting element having a plurality of light emitting units will be described in this embodiment.

Figure 7:
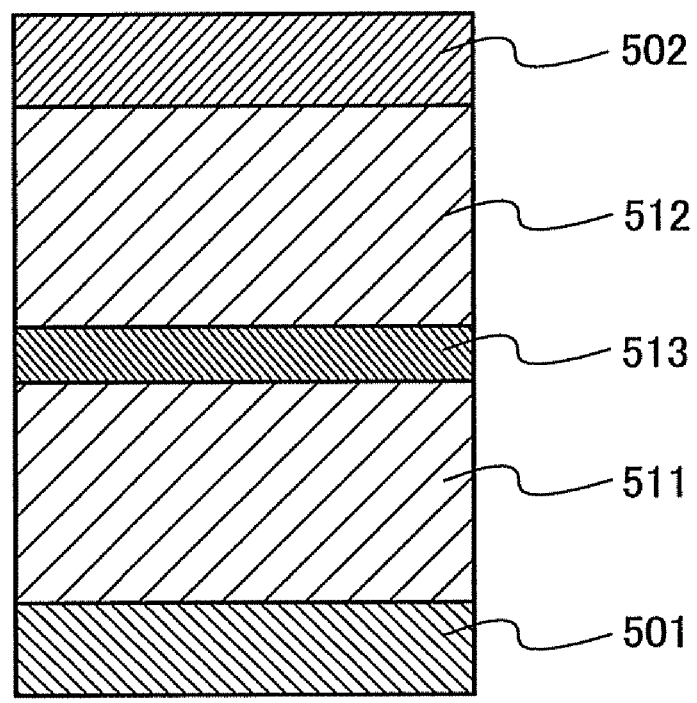
FIG. 7 illustrates a light emitting element according to an embodiment of the present invention.

In FIG. 7, a first light emitting unit 511 and a second light emitting unit 512 are stacked between a first electrode 501 and a second electrode 502. A charge generation layer 513 is provided between the first light emitting unit 511 and the second light emitting unit 512. To the first electrode 501 and the second electrode 502, similar electrodes to those described in Embodiment 1 can be applied. The first light emitting unit 511 and the second light emitting unit 512 may have the same structure or different structures, and the structures, described in Embodiment 1 can be applied.

The charge generation layer 513 includes a composite material of an organic compound and metal oxide. The composite material of an organic compound and metal oxide is the composite material described in Embodiment 1, and includes an organic compound and metal oxide such as vanadium oxide, molybdenum oxide, or tungsten oxide. As the organic compound, various compounds such as an aromatic amine compound, a carbazole derivative, aromatic hydrocarbon, and a high molecular compound (oligomer, dendrimer, polymer, or the like) can be used. Note that the organic compound having a hole mobility of $10^{-6}$ $cm^2/Vs$ or more is preferably used as an organic compound having a hole transporting property. Note that any other substance having a hole transporting property which is higher than an electron transporting property may be used. The composite material of an organic compound and metal oxide is superior in carrier injecting property and carrier transporting property, and accordingly, low-voltage driving and low-current driving can be realized.

Note that the charge generation layer 513 may be formed with a combination of a composite material of an organic compound and metal oxide and other materials. For example, the charge generation layer 513 may be formed with a combination of a layer including the composite material of an organic compound and metal oxide and a layer including a compound having a high electron transporting property and an electron donating substance with respect to the compound having the high electron transporting property. Further, the charge generation layer 513 may be formed with a combination of a layer including the composite material of an organic compound and metal oxide and a transparent conductive film.

In any cases, the charge generation layer 513 interposed between the first light emitting unit 511 and the second light emitting unit 512 is acceptable as long as electrons are injected to a light emitting unit on one side and holes are injected to a light emitting unit on the other side when voltage is applied to the first electrode 501 and the second electrode 502. For example, in FIG. 7, any layer can be employed as the charge generation layer 513 as long as the layer injects electrons into the first light emitting unit 511 and holes into the second light emitting unit 512 when voltage is applied so that the potential of the first electrode 501 is higher than that of the second electrode 502.

In this embodiment, the light emitting element having two light emitting units is described; however, similarly, an embodiment can be applied to a light emitting element in which three or more light emitting units are stacked. When a plurality of light emitting units is arranged to be partitioned from each other with a charge generation layer between a pair of electrodes, like the light emitting element according to this embodiment, light emission from a region of high luminance can be realized at a low current density, and thus, an element with a long life can be achieved.

Note that this embodiment can be combined with any of other embodiments, as appropriate.

Embodiment 3

In this embodiment, a light emitting device having a light emitting element according to an embodiment of the present invention will be described.

Figure 8A:
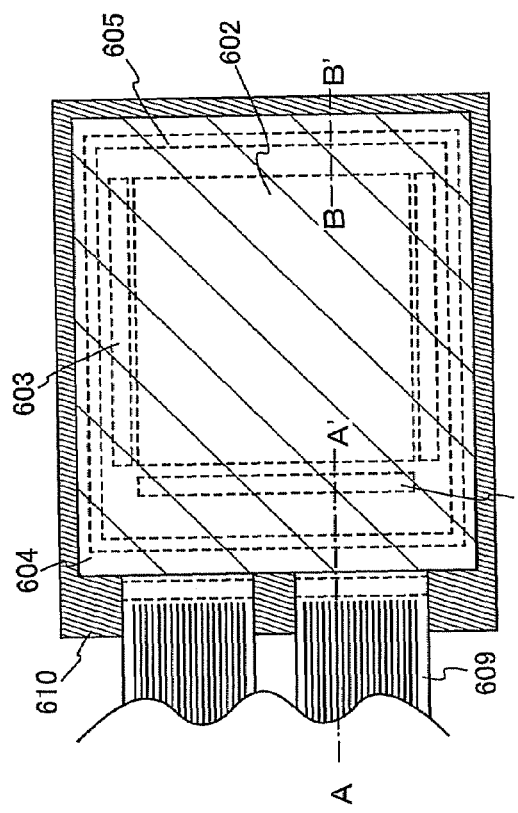
FIGS. 8A and 8B illustrate a light emitting device according to an embodiment of the present invention.
Figure 8B:
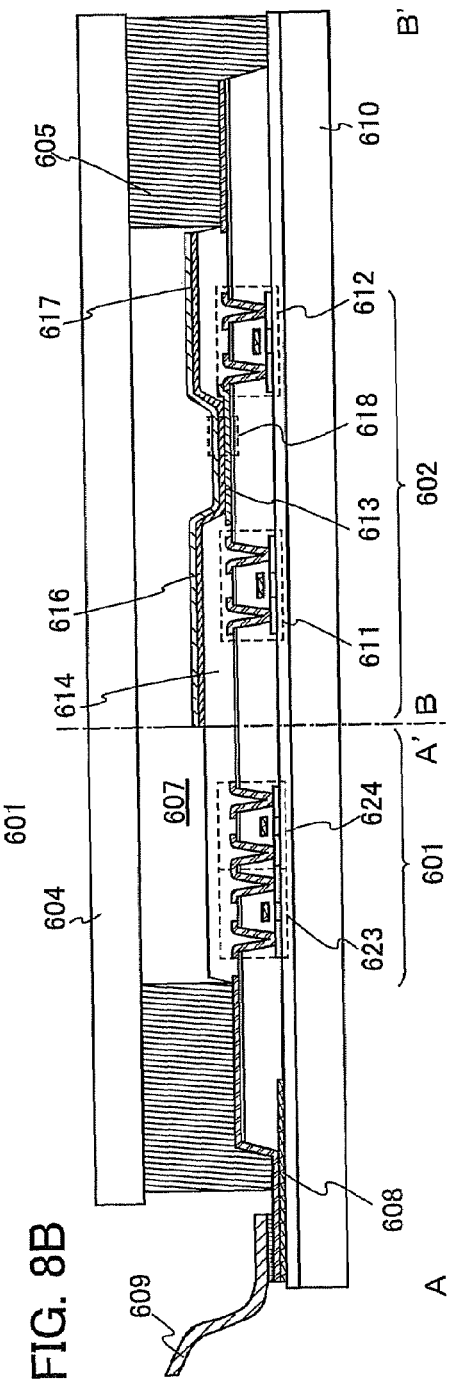

A light emitting device having the light emitting element according to an embodiment of the prevent invention in a pixel portion will be described in this embodiment with reference to FIGS. 8A and 8B. FIG. 8A is a top view illustrating the light emitting device, and FIG. 8B is a cross sectional view taken along line A-A' and line B-B' of FIG. 8A. This light emitting device includes a driver circuit portion (source side driver circuit) 601, a pixel portion 602, and a driver circuit portion (gate side driver circuit) 603 which are illustrated by dotted lines in order to control the light emission of the light emitting element. Reference numeral 604 denotes a sealing substrate; reference numeral 605 denotes a sealing material; and a portion surrounded by the sealing material 605 corresponds to a space 607.

Note that a leading wiring 608 is a wiring for transmitting signals input in the source side driver circuit 601 and the gate side driver circuit 603. The leading wiring 608 receives video signals, clock signals, start signals, reset signals, and the like from a flexible printed circuit (FPC) 609 that serves as an external input terminal. Although only the FPC is illustrated here, the FPC may be provided with a printed wiring board (PWB). The light emitting device according to this specification includes not only a light emitting device body but also a state in which an FPC or a PWB is attached thereto.

Next, the sectional structure will be described with reference to FIG. 8B. The driver circuit portion and the pixel portion are formed over an element substrate 610, and the source side driver circuit 601, which is one of the driver circuit portions, and one pixel in the pixel portion 602 are illustrated.

Note that as the source side driving circuit 601, a CMOS circuit in which an n-channel TFT 623 and a p-channel TFT 624 are combined is formed. The driver circuit may be formed by various CMOS circuits, PMOS circuits, or NMOS circuits. Although a driver-integration type device, in which a driver circuit is formed over the substrate provided with the pixel portion, is described in this embodiment, a driver circuit is not necessarily formed over the substrate provided with the pixel portion, but can be formed outside a substrate.

The pixel portion 602 has a plurality of pixels, each of which includes a switching TFT 611, a current control TFT 612, and a first electrode 613 which is electrically connected to a drain of the current control TFT 612. Note that an insulator 614 is formed so as to cover an end portion of the first electrode 613. Here, the insulator 614 is formed using a positive photosensitive acrylic resin film.

In order to prevent adverse influence on a light-emitting element 618, the insulator 614 is provided such that either an upper end portion or a lower end portion of the insulator has a curved surface with a curvature. For example, in the case of using positive photosensitive acrylic as a material for the insulator 614, it is preferable that the insulator 614 be formed so as to have a curved surface with a curvature radius (0.2 μm to 3 μm) the upper end portion of the insulator 614. Note that the insulator 614 can be formed using either negative photosensitive acrylic that becomes insoluble in an etchant due to light irradiation, or positive photosensitive acrylic that becomes soluble in an etchant due to light irradiation.

An EL layer 616 and a second electrode 617 are formed over the first electrode 613. Here, the first electrode 613 can be formed with various metals, alloys, electrically conductive compounds, or mixture thereof. If the first electrode 613 is used as an anode, it is preferable to use a metal, an alloy, an electrically conductive compound, a mixture thereof, or the like with a high work function (a work function of 4.0 eV or higher) among such materials. For example, a stacked-layer structure of a film including a titanium nitride film and a film including aluminum as its main component, a three-layer structure of a titanium nitride film, a film including aluminum as its main component, and a titanium nitride film, or the like can be used in addition to a single layer of indium tin oxide including silicon, indium zinc oxide, a titanium nitride film, a chromium film, a tungsten film, a Zn film, a Pt film, or the like.

The EL layer 616 is formed by various methods such as an evaporation method using an evaporation mask, an inkjet method, a spin coating method, or the like. The EL layer 616 has the light emitting layer described in Embodiment 1. Further, the EL layer 616 may be formed using another material including a low molecular compound or a high molecular compound (including oligomer and dendrimer). As the material for the EL layer 616, not only an organic compound but also an inorganic compound may be used.

The second electrode 617 can be formed with various metals, alloys, electrically conductive compounds, or mixtures of these. If the second electrode is used as a cathode, it is preferable to use a metal, an alloy, an electrically conductive compound, a mixture of these, or the like with a low work function (a work function of 3.8 eV or lower) among such materials. As an example, an element belonging to Group 1 or Group 2 in the periodic table, that is, an alkali metal such as lithium (Li) or cesium (Cs); an alkaline earth metal such as magnesium (Mg), calcium (Ca), or strontium (Sr); an alloy including any of these (MgAg, AlLi); and the like can be given. In the case where light generated in the EL layer 616 is transmitted through the second electrode 617, the second electrode 617 can be formed using a stacked layer of a metal thin film whose thickness is made small, and a transparent conductive film (indium tin oxide (ITO), indium tin oxide including silicon or silicon oxide, indium zinc oxide (IZO), indium oxide including tungsten oxide and zinc oxide (IWZO), or the like).

By attaching the sealing substrate 604 to the element substrate 610 with the sealing material 605, a light emitting element 618 is provided in the space 607 which is surrounded by the element substrate 610, the sealing substrate 604, and the sealing material 605. Note that the space 607 is filled with a filler and may be filled with an inert gas (such as nitrogen or argon), the sealing material 605, or the like.

As the sealing material 605, an epoxy resin is preferably used. In addition, it is desirable to use a material that allows permeation of moisture or oxygen as little as possible. As the sealing substrate 604, a plastic substrate formed with Fiberglass-Reinforced Plastics (FRP), polyvinyl fluoride (PVF), polyester, acrylic, or the like can be used besides a glass substrate or a quartz substrate.

As described above, the light emitting device having the light emitting element according to an embodiment of the present invention can be obtained.

The light emitting device according to an embodiment of the present invention includes the light emitting element described in Embodiment 1 or Embodiment 2. Therefore, a light emitting device with high luminous efficiency can be obtained. In addition, power consumption of the light emitting device can be reduced.

Figure 9A:
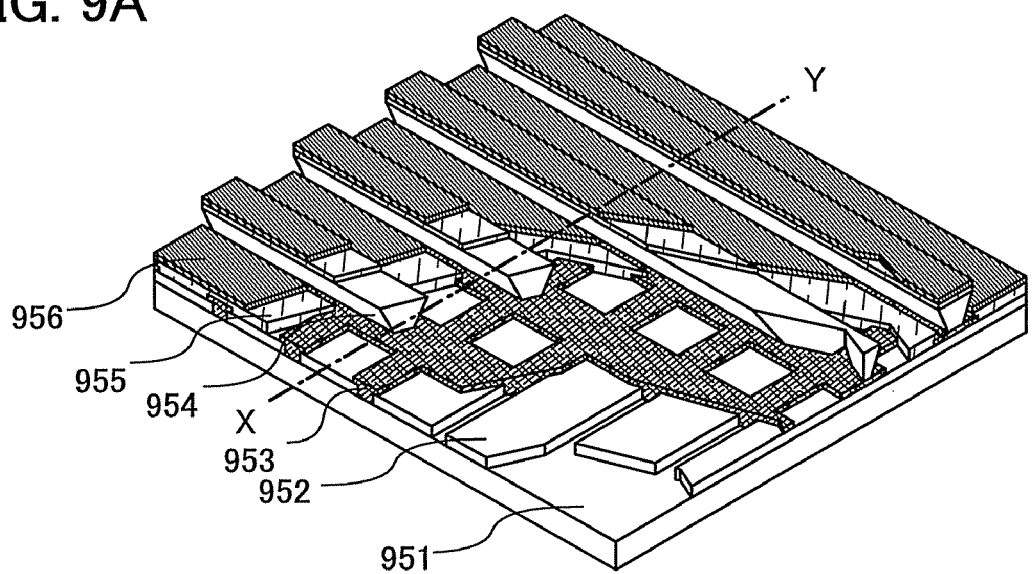
FIGS. 9A and 9B illustrate a light emitting device according to an embodiment of the present invention.
Figure 9B:
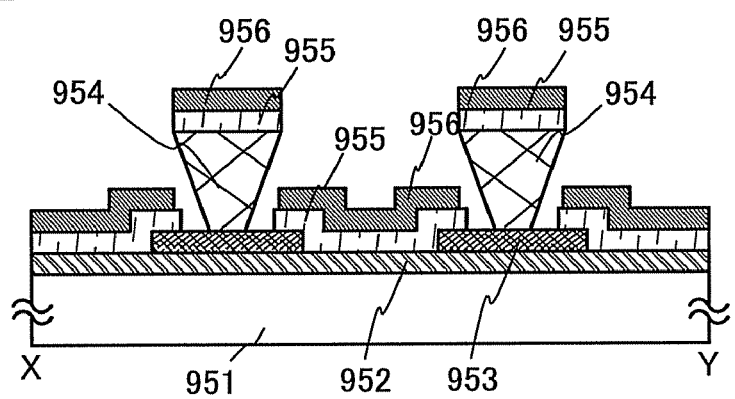

Although an active matrix light emitting device in which driving of a light emitting element is controlled by thin film transistors is described in this embodiment as described above, the light emitting device may be replaced with a passive matrix light emitting device. FIGS. 9A and 9B illustrate a passive matrix light emitting device which is manufactured by application of an embodiment of the present invention. Note that FIG. 9A is a perspective view illustrating the light emitting device, and FIG. 9B is a cross-sectional view of FIG. 9A taken along line X-Y. In FIGS. 9A and 9B, over a substrate 951, an EL layer 955 is provided between an electrode 952 and an electrode 956. The end portion of the electrode 952 is covered with an insulating layer 953. A partition layer 954 is provided over the insulating layer 953. The sidewalls of the partition layer 954 are aslope so that a distance between both sidewalls is gradually narrowed toward the surface of the substrate. That is, a cross section in the direction of a narrow side of the partition layer 954 has a trapezoidal shape, and a lower side (which faces a surface of the insulating layer 953 and is in contact with the insulating layer 953) is shorter than an upper side (which faces the surface of the insulating layer 953 and is not in contact with the insulating layer 953). A cathode can be patterned by providing the partition layer 954 in this manner. In addition, in a passive matrix light emitting device, a light emitting device with low power consumption can be obtained by including a light emitting element with high luminous efficiency according to an embodiment of the present invention.

Note that this embodiment can be combined with any of other embodiments, as appropriate.

Embodiment 4

In this embodiment, an electronic device according to an embodiment of the present invention including the light emitting device described in Embodiment 3 as part thereof will be described. The electronic device according to an embodiment of the present invention has the light emitting element described in Embodiment 1 or Embodiment 2, and a display portion with high luminous efficiency. Moreover, a display portion having low power consumption is included.

As an electronic device manufactured using the light emitting device according to an embodiment of the present invention, a camera such as a video camera or a digital camera, a goggle type display, a navigation system, an audio reproducing device (car audio set, audio component set, or the like), a computer, a game machine, a portable information terminal (mobile computer, cellular phone, portable game machine, e-book reader, or the like), and an image reproducing device provided with a recording medium (specifically, a device provided with a display device that can reproduce a recording medium and display the image such as a Digital Versatile Disc (DVD)), and the like can be given. Specific examples of these electronic devices are illustrated in FIGS. 10A to 10D.

Figure 10A:
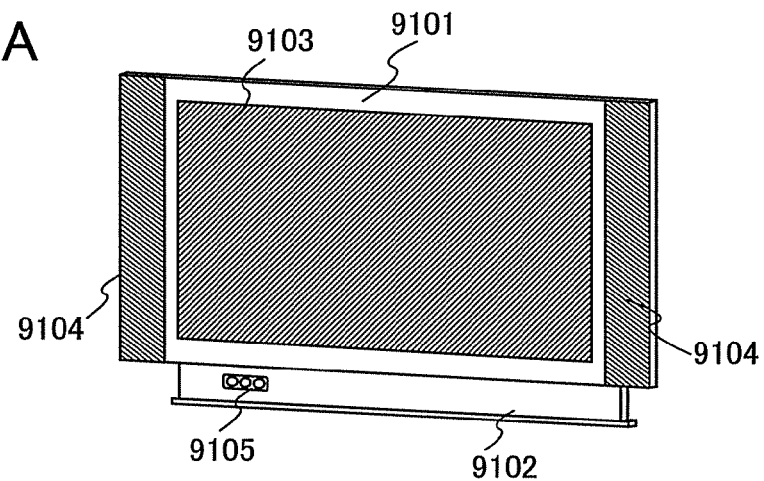
FIGS. 10A to 10D each illustrate an electronic device according to an embodiment of the present invention.

FIG. 10A illustrates a television device according to this embodiment, which includes a housing 9101, a support base 9102, a display portion 9103, a speaker portion 9104, a video input terminal 9105, and the like. In the display portion 9103 of this television device, the light emitting elements described in Embodiment 1 or Embodiment 2 are arranged in matrix. One feature of the light emitting element is that luminous efficiency is high and power consumption is low. Since the display portion 9103 constructed of such light emitting elements has similar characteristics, this television device consumes less power. With such characteristics, the number or scale of power supply circuits in the television device can be drastically reduced, and therefore, the size and weight of the housing 9101 and the support base 9102 can be reduced. In the television device according to this embodiment, reduction in power consumption and reduction in size and weight are achieved; therefore, a product which is suitable for living environment can be provided.

Figure 10B:
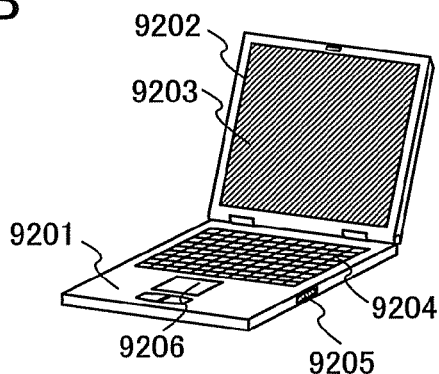

FIG. 10B illustrates a computer according to this embodiment, which includes a main body 9201, a housing 9202, a display portion 9203, a keyboard 9204, an external connection port 9205, a pointing device 9206, and the like. In the display portion 9203 of this computer, the light emitting elements described in Embodiment 1 or Embodiment 2 are arranged in matrix. One feature of the light emitting element is that luminous efficiency is high and power consumption is low. Since the display portion 9203 constructed of such light emitting elements has similar characteristics, this computer consumes less power. With such characteristics, the number or scale of power supply circuits in the computer can be drastically reduced, and therefore, the size and weight of the main body 9201 and the housing 9202 can be reduced. In the computer according to this embodiment, reduction in power consumption and reduction in size and weight are achieved; therefore, a product which is suitable for environment can be provided.

Figure 10C:
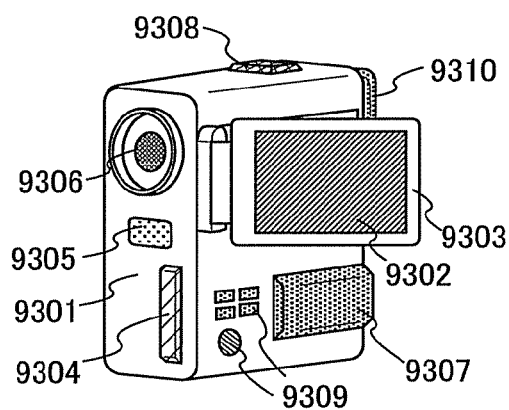

FIG. 10C illustrates a camera that includes a main body 9301, a display portion 9302, a housing 9303, an external connection port 9304, a remote control receiving portion 9305, an image receiving portion 9306, a battery 9307, an audio input portion 9308, operation keys 9309, an eyepiece portion 9310, and the like. In the display portion 9302 of this camera, the light emitting elements described in Embodiment 1 or Embodiment 2 are arranged in matrix. One feature of the light emitting element is that luminous efficiency is high and power consumption is low. Since the display portion 9302 constructed of such light emitting elements has similar characteristics, this camera consumes less power. With such characteristics, the number or scale of power supply circuits in the camera can be drastically reduced, and therefore, the size and weight of the main body 9301 can be reduced. In the camera according to this embodiment, reduction in power consumption and reduction in size and weight are achieved; therefore, a product which is suitable for being carried around can be provided.

Figure 10D:
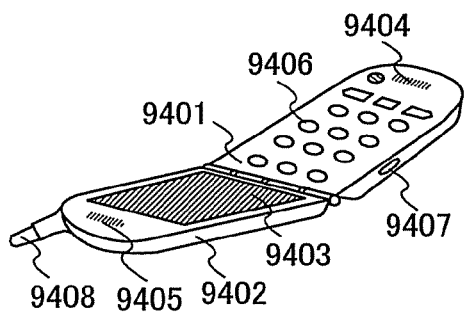

FIG. 10D illustrates a cellular phone according to this embodiment, which includes a main body 9401, a housing 9402, a display portion 9403, an audio input portion 9404, an audio output portion 9405, operation keys 9406, an external connection port 9407, an antenna 9408, and the like. In the display portion 9403 of this cellular phone, the light emitting elements described in Embodiment 1 or Embodiment 2 are arranged in matrix. One feature of the light emitting element is that luminous efficiency is high and power consumption is low. Since the display portion 9403 constructed of such light emitting elements has similar characteristics, this cellular phone consumes less power. With such characteristics, the number or scale of power supply circuits in the cellular phone can be drastically reduced, and therefore, the size and weight of the main body 9401 and the housing 9402 can be reduced. In the cellular phone according to this embodiment, reduction in power consumption and reduction in size and weight are achieved; therefore, a product which is suitable for being carried around can be provided.

Figure 16A:
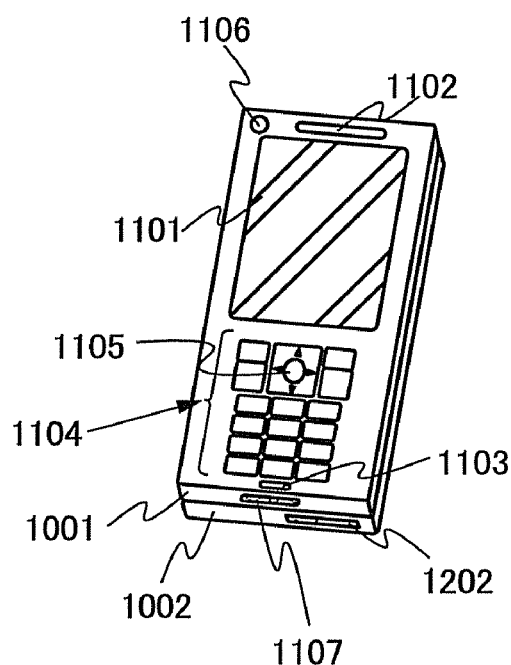
FIGS. 16A to 16C illustrate an electronic device according to an embodiment of the present invention.
Figure 16B:
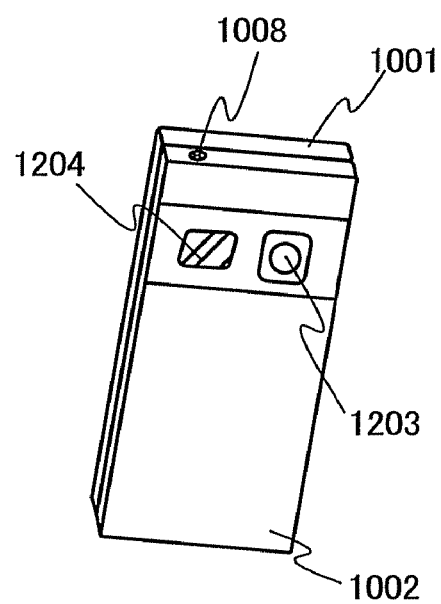
Figure 16C:
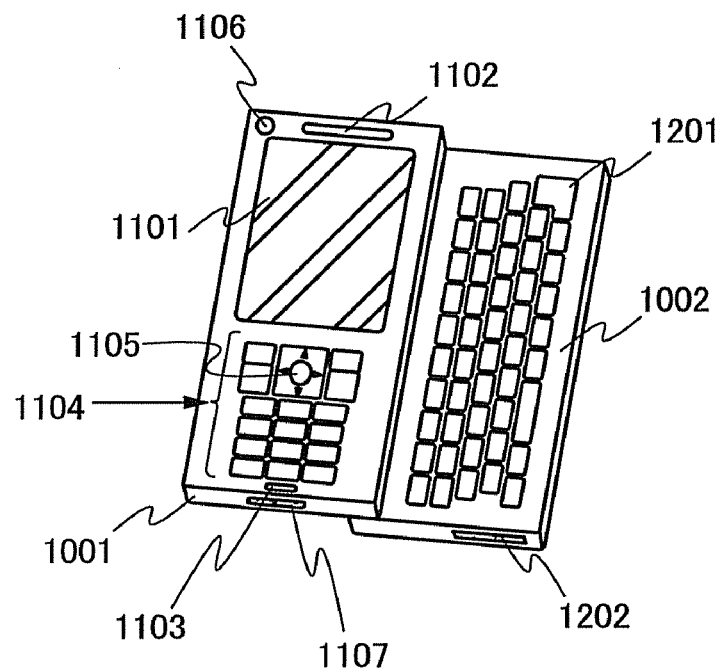

FIGS. 16A to 16C illustrate an example of a structure of a cellular phone, which is different from the structure of the cellular phone of FIG. 10D. FIG. 16A is a front view, FIG. 16B is a rear view, and FIG. 16C is a development view. The cellular phone illustrated in FIGS. 16A to 16C is a so-called smartphone which has both a function as a phone and a function as a portable information terminal, and incorporates a computer to conduct a variety of data processing in addition to voice calls.

The cellular phone illustrated in FIGS. 16A to 16C has two housings 1001 and 1002. The housing 1001 includes a display portion 1101, a speaker 1102, a microphone 1103, operation keys 1104, a pointing device 1105, a camera lens 1106, an external connection terminal 1107, and the like, while the housing 1002 includes a keyboard 1201, an external memory slot 1202, a camera lens 1203, a light 1204, an earphone terminal 1008, and the like. In addition, an antenna is incorporated in the housing 1001.

In addition to the above structure, the cellular phone may incorporate a non-contact IC chip, a small size memory device, or the like.

In the display portion 1101, the light emitting device described in Embodiment 3 can be incorporated, and a display direction can be changed as appropriate depending on the usage mode. The cellular phone is provided with the camera lens 1106 on the same surface as the display portion 1101, and thus it can be used as a video phone. Further, a still image and a moving image can be taken with the camera lens 1203 and the light 1204 by using the display portion 1101 as a viewfinder. The speaker 1102 and the microphone 1103 are not limited to use for verbal communication, and can be used for a videophone, recording, reproduction, and the like. With use of the operation keys 1104, operation of incoming and outgoing calls, simple information input of electronic mails or the like, scrolling of a screen, cursor motion, and the like are possible. Furthermore, the housing 1001 and the housing 1002 (FIG. 16A), which are overlapped with each other, are slid to expose the housing 1002 as illustrated in FIG. 16C, and can be used as a portable information terminal. In this case, smooth operation is possible with use of the keyboard 1201 and the pointing device 1105. The external connection terminal 1107 can be connected to an AC adapter or a variety of cables such as a USB cable, and can be charged and perform data communication with a computer or the like. Moreover, a large amount of data can be stored by inserting a storage medium into the external memory slot 1202 and can be moved.

In addition to the above-described functions, the cellular phone may also have an infrared communication function, a television reception function, or the like.

Figure 11:
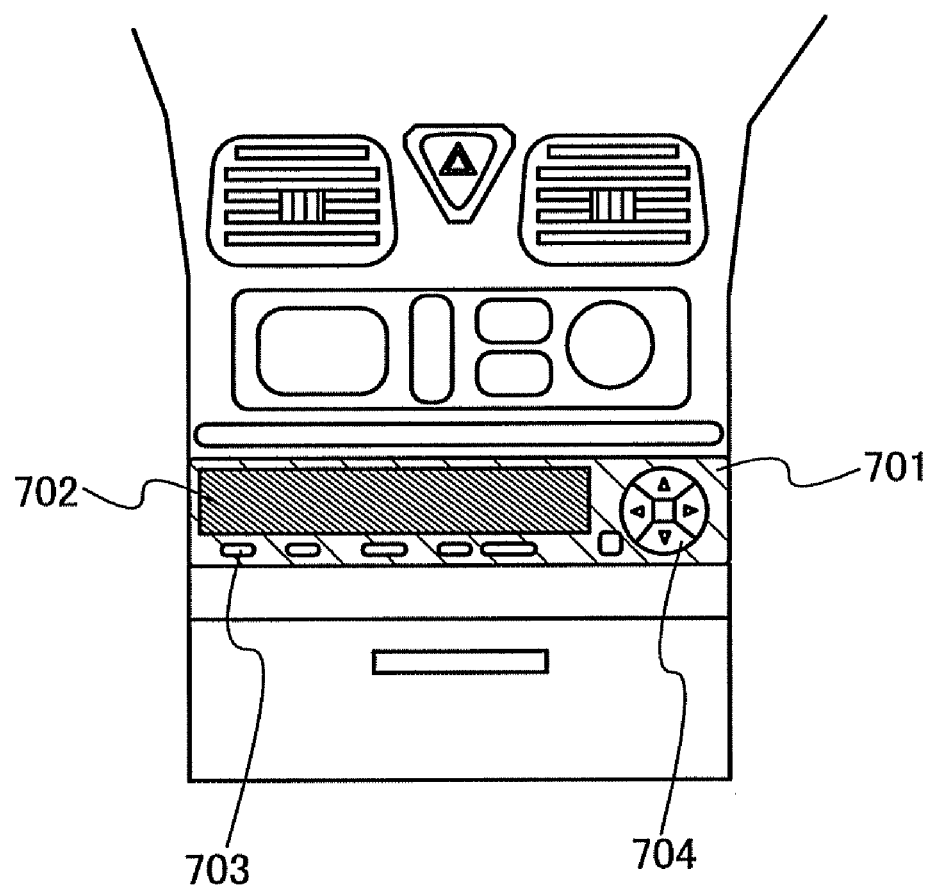
FIG. 11 illustrates an electronic device according to an embodiment of the present invention.

FIG. 11 illustrates an audio reproducing device, specifically, a car audio system, which includes a main body 701, a display portion 702, and operation switches 703 and 704. The display portion 702 can be realized by the (passive matrix or active matrix) light emitting device described in Embodiment 3. Further, the display portion 702 may employ a segment type light emitting device. In any case, the use of a light emitting element according to an embodiment of the present invention makes it possible to form a bright display portion while achieving low power consumption, with the use of a vehicle power source (12 V to 42 V). Although an in-car audio system is described in this embodiment, an embodiment may be used for a portable audio device or an audio device for household use.

Figure 12:
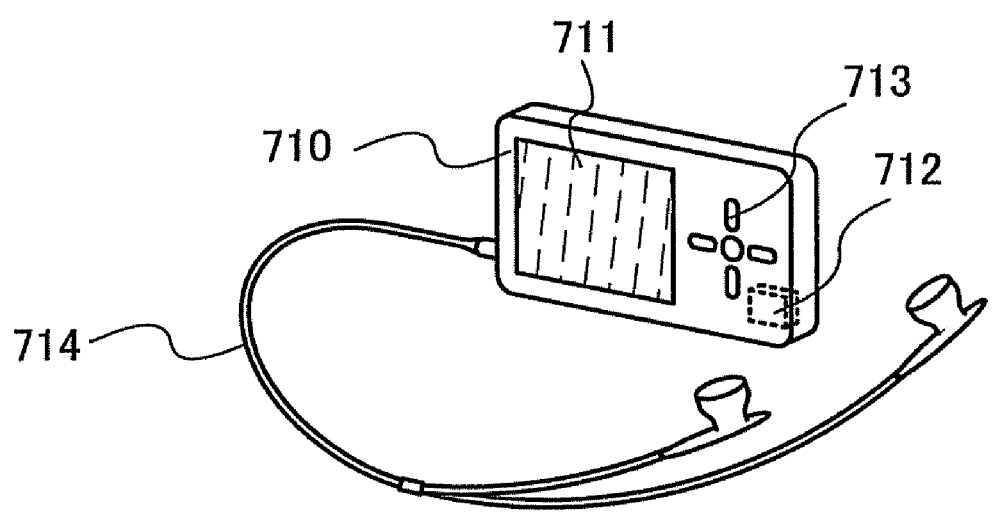
FIG. 12 illustrates an electronic device according to an embodiment of the present invention.

FIG. 12 illustrates a digital player as an example of an audio reproducing device. The digital player illustrated in FIG. 12 includes a main body 710, a display portion 711, a memory portion 712, an operation portion 713, earphones 714, and the like. Note that headphones or wireless earphones can be used instead of the earphones 714. The display portion 711 can be realized by the (passive matrix or active matrix) light emitting device described in Embodiment 3. Further, the display portion 711 may employ a segment type light emitting device. In any case, the use of a light emitting element according to an embodiment of the present invention makes it possible to form a bright display portion which can display images even when using a secondary battery (a nickel-hydrogen battery or the like) while achieving low power consumption. As the memory portion 712, a hard disk or a nonvolatile memory is used. For example, a NAND type nonvolatile memory with a recording capacity of 20 gigabytes (GB) to 200 gigabytes (GB) is used, and by operating the operation portion 713, an image or sound (e.g., music) can be recorded and reproduced. Note that power consumption of the display portions 702 in FIG. 11 and the display portion 711 in FIG. 12 can be suppressed through display of white characters on the black background. This is particularly effective for portable audio systems.

As described above, the applicable range of the light emitting device manufactured by applying an embodiment of the present invention is so wide that the light emitting device is applicable to electronic devices in various fields. By applying an embodiment of the present invention, an electronic device which has high luminous efficiency and a display portion consuming less power can be manufactured.

The light emitting device according to an embodiment of the present invention can also be used as a lighting device. An example using the light emitting element according to an embodiment of the present invention as a lightning device will be described with reference to FIG. 13.

Figure 13:
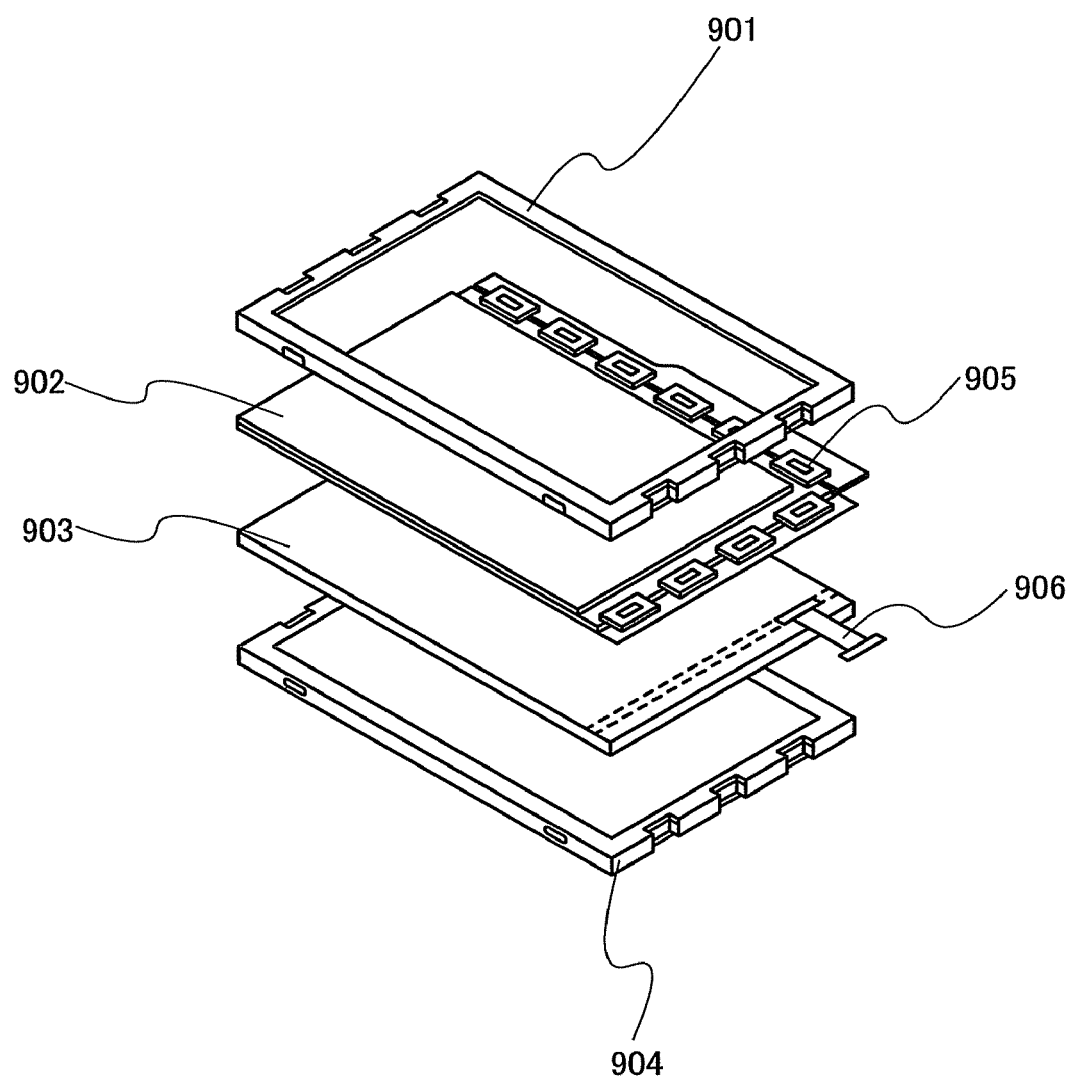
FIG. 13 illustrates an electronic device according to an embodiment of the present invention.

FIG. 13 illustrates a liquid crystal display device using the light emitting device to which an embodiment of the present invention is applied as a backlight, as an example of the electronic device using a light emitting device according to an embodiment of the present invention as a lighting device. The liquid crystal display device illustrated in FIG. 13 includes a housing 901, a liquid crystal layer 902, a backlight 903, and a housing 904. The liquid crystal layer 902 is connected to a driver IC 905. The light emitting device to which an embodiment of the present invention is applied is used as the backlight 903, and current is supplied through a terminal 906.

Since the light emitting device according to an embodiment of the present invention is thin and has high luminous efficiency and low power consumption, reduction in thickness and power consumption of a display device is possible by using a light emitting device according to an embodiment of the present invention as a backlight of the liquid crystal display device. Moreover, a light emitting device according to an embodiment of the present invention is a plane emission type lighting device and can have a large area. Thus, the backlight can have a large area, and a liquid crystal display device having a large area can also be obtained.

Figure 14:
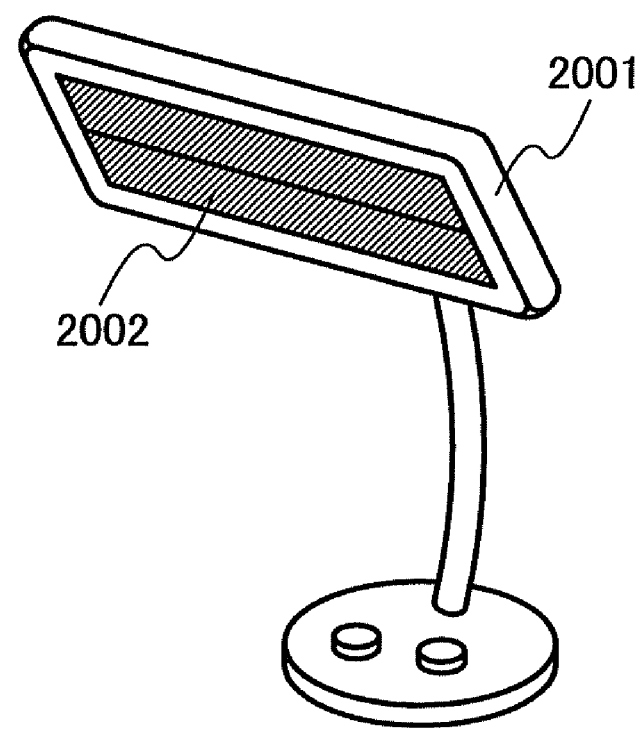
FIG. 14 illustrates a lighting device according to an embodiment of the present invention.

FIG. 14 illustrates an example in which a light emitting device according to an embodiment of the present invention is used as a desk lamp, which is one of lighting devices. The desk lamp illustrated in FIG. 14 includes a housing 2001 and a light source 2002, and a light emitting device according to an embodiment of the present invention is used as the light source 2002. The light emitting device according to an embodiment of the present invention have high luminous efficiency and low power consumption; thus, the desk lamp also has low power consumption.

Figure 15:
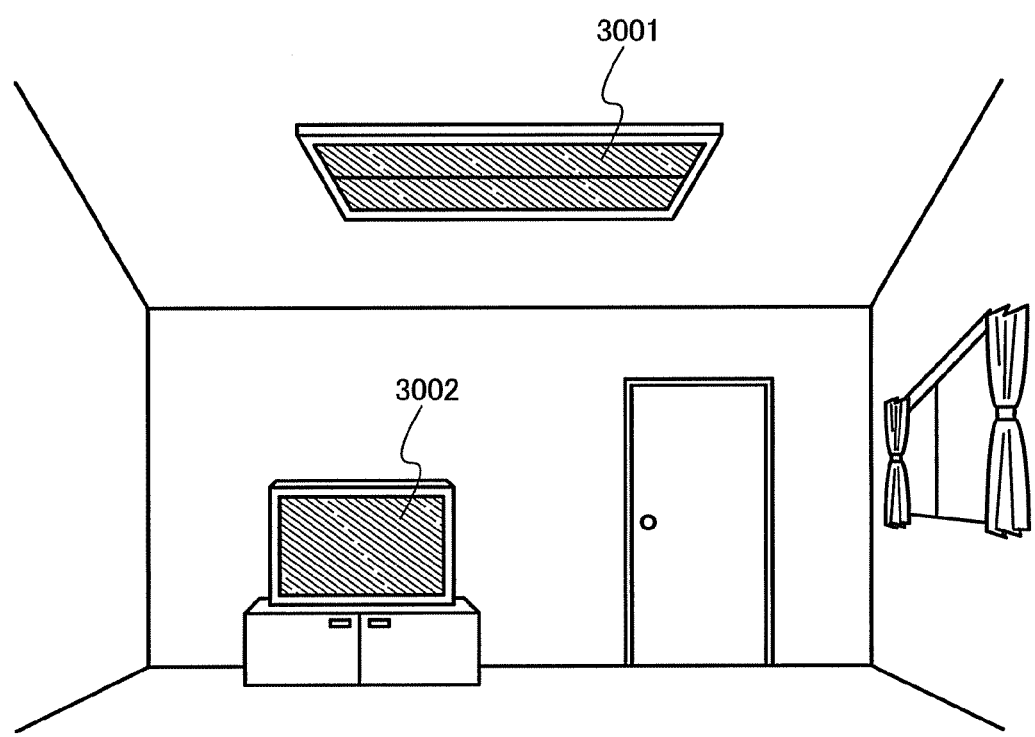
FIG. 15 illustrates a lighting device according to an embodiment of the present invention.

FIG. 15 illustrates an example of using the light emitting device, to which an embodiment of the present invention is applied, as an indoor lighting device 3001. Because the light emitting device according to an embodiment of the present invention can have a large area, a light emitting device according to an embodiment of the present invention can be used as a lighting device having a large area. Moreover, because the light emitting device according to an embodiment of the present invention has high luminous efficiency and low power consumption, the light emitting device according to an embodiment of the present invention can be used as a lighting device which consumes less power. As illustrated in the drawing, a television device 3002 according to an embodiment of the present invention as illustrated in FIG. 10A may be set in a room where the light emitting device to which an embodiment of the present invention is applied is used as the indoor lighting device 3001, and public broadcasting or movies can be appreciated there. In such a case, since both devices consume less power, environmental load can be reduced.

Note that this embodiment can be combined with any of other embodiments, as appropriate.

This application is based on Japanese Patent Application serial No. 2008-223217 filed with Japan Patent Office on Sep. 1, 2008, the entire contents of which are hereby incorporated by reference.

What is claimed is:

1. A light emitting element comprising:
a first layer; a second layer; a third layer; and a fourth layer which are sequentially provided on an anode side between an anode and a cathode,
wherein the first layer includes a first phosphorescent compound and a first organic compound that has a hole transporting property,
wherein the second layer includes a first fluorescent organic compound and a second organic compound that has a hole transporting property,
wherein the third layer includes a second fluorescent organic compound and a first organic compound that has an electron transporting property, and
wherein the fourth layer includes a second phosphorescent compound and a second organic compound having an electron transporting property, wherein triplet excitation energy of the second organic compound having a hole transporting property is higher than or equal to triplet excitation energy of the first organic compound having a hole transporting property, and wherein triplet excitation energy of the first organic compound having an electron transporting property is higher than or equal to triplet excitation energy of the second organic compound having an electron transporting property.

2. The light emitting element according to claim 1, wherein the first organic compound having a hole transporting property and the second organic compound having a hole transporting property are the same organic compound.

3. The light emitting element according to claim 1, wherein the first organic compound having an electron transporting property and the second organic compound having an electron transporting property are the same organic compound.

4. The light emitting element according to claim 1, wherein a spacing layer formed using one or both of the first organic compound having a hole transporting property and the second organic compound having a hole transporting property is provided between the first layer and the second layer.

5. The light emitting element according to claim 1, wherein a spacing layer formed using one or both of the first organic compound having an electron transporting property and the second organic compound having an electron transporting property is provided between the third layer and the fourth layer.

6. The light emitting element according to claim 1, wherein a total thickness of the second layer and the third layer is greater than or equal to 5 nm and less than or equal to 20 nm.

7. The light emitting element according to claim 1, wherein a concentration of the first fluorescent compound in the second layer is greater than or equal to 0.1 wt % and less than or equal to 10 wt %.

8. The light emitting element according to claim 1, wherein a concentration of the second fluorescent compound in the third layer is greater than or equal to 0.1 wt % and less than or equal to 10 wt %.

9. The light emitting element according to claim 1, wherein the first fluorescent compound and the second fluorescent compound are a same organic compound.

10. The light emitting element according to claim 9, wherein an emission color of the first fluorescent compound and the second fluorescent compound is blue, and wherein an emission color of the first phosphorescent compound is green and emission color of the second phosphorescent compound is red.

11. The light emitting element according to claim 1, wherein the first phosphorescent compound and the second phosphorescent compound are a same organic compound.

12. The light emitting element according to claim 11, wherein an emission color of the first phosphorescent compound and the second phosphorescent compound and an emission color of the first fluorescent compound and the second fluorescent compound are complementary to each other.

13. A lighting device comprising the light emitting element according to claim 1.

14. A light emitting element comprising:
a first layer on an anode, wherein the first layer includes a first phosphorescent compound and a first organic compound having a hole transporting property;
a second layer on the first layer, wherein the second layer includes a first fluorescent organic compound and a second organic compound having an hole transporting property;
a third layer on the second layer, wherein the third layer includes a second fluorescent organic compound and a first organic compound having an electron transporting property; and
a fourth layer on the third layer, wherein the fourth layer includes a second phosphorescent compound and a second organic compound having an electron transporting property, wherein triplet excitation energy of the second organic compound having a hole transporting property is higher than or equal to triplet excitation energy of the first organic compound having a hole transporting property, and wherein triplet excitation energy of the first organic compound having an electron transporting property is higher then or equal to triplet excitation energy of the second organic compound having an electron transporting property.

15. The light emitting element according to claim 14, wherein the first organic compound having a hole transporting property and the second organic compound having a hole transporting property are the same organic compound.

16. The light emitting element according to claim 14, wherein the first organic compound having an electron transporting property and the second organic compound having an electron transporting property are the same organic compound.

17. The light emitting element according to claim 14, wherein a spacing layer formed using one or both of the first organic compound having a hole transporting property and the second organic compound having a hole transporting property is provided between the first layer and the second layer.

18. The light emitting element according to claim 14, wherein a spacing layer formed using one or both of the first organic compound having an electron transporting property and the second organic compound having an electron transporting property is provided between the third layer and the fourth layer.

19. The light emitting element according to claim 14, wherein a total thickness of the second layer and the third layer is greater than or equal to 5 nm and less than or equal to 20 nm.

20. The light emitting element according to claim 14, wherein a concentration of the first fluorescent compound in the second layer is greater than or equal to 0.1 wt % and less than or equal to 10 wt %.

21. The light emitting element according to claim 14, wherein a concentration of the second fluorescent compound in the third layer is greater than or equal to 0.1 wt % and less than or equal to 10 wt %.

22. The light emitting element according to claim 14, wherein the first fluorescent compound and the second fluorescent compound are a same organic compound.

23. The light emitting element according to claim 22, wherein an emission color of the first fluorescent compound and the second fluorescent compound is blue, and wherein an emission color of the first phosphorescent compound is green and emission color of the second phosphorescent compound is red.

24. The light emitting element according to claim 14, wherein the first phosphorescent compound and the second phosphorescent compound are a same organic compound.

25. The light emitting element according to claim 14, wherein an emission color of the first phosphorescent compound and the second phosphorescent compound and an emission color of the first fluorescent compound and the second fluorescent compound are complementary to each other.

26. A lighting device comprising the light emitting element according to claim 14.

27. A light emitting element comprising:
a first electrode;
a first light emitting unit over the first electrode;
a charge generation layer provided over the first light emitting unit;
a second light emitting unit over the charge generation layer; and
a second electrode over the second light emitting element,
wherein each of the first and second light emitting units comprising;
a first layer;
a second layer over the first layer;
a third layer over the second layer; and
a fourth layer over the third layer,
wherein the first layer includes a first phosphorescent compound and a first organic compound having a hole transporting property,
wherein the second layer includes a first fluorescent compound and a second organic compound having a hole transporting property,
wherein the third layer includes a second fluorescent compound and a first organic compound having an electron transporting property,
wherein the fourth layer includes a second phosphorescent compound and a second organic compound having an electron transporting property,
wherein triplet excitation energy of the second organic compound having a hole transporting property is higher than or equal to triplet excitation energy of the first organic compound having a hole transporting property, and
wherein triplet excitation energy of the first organic compound having an electron transporting property is higher than or equal to triplet excitation energy of the second organic compound having an electron transporting property.

28. The light emitting element according to claim 27, wherein the first organic compound having a hole transporting property and the second organic compound having a hole transporting property are the same organic compound.

29. The light emitting element according to claim 27, wherein the first organic compound having an electron transporting property and the second organic compound having an electron transporting property are the same organic compound.

30. The light emitting element according to claim 27, wherein a spacing layer formed using one or both of the first organic compound having a hole transporting property and the second organic compound having a hole transporting property is provided between the first layer and the second layer.

31. The light emitting element according to claim 27, wherein a spacing layer formed using one or both of the first organic compound having an electron transporting property and the second organic compound having an electron transporting property is provided between the third layer and the fourth layer.

32. The light emitting element according to claim 27, wherein a total thickness of the second layer and the third layer is greater than or equal to 5 nm and less than or equal to 20 nm.

33. The light emitting element according to claim 27, wherein a concentration of the first fluorescent compound in the second layer is greater than or equal to 0.1 wt % and less than or equal to 10 wt %.

34. The light emitting element according to claim 27, wherein a concentration of the second fluorescent compound in the third layer is greater than or equal to 0.1 wt % and less than or equal to 10 wt %.

35. The light emitting element according to any one of claim 27,
wherein the first fluorescent compound and the second fluorescent compound are a same organic compound.

36. The light emitting element according to claim 27,
wherein an emission color of the first fluorescent compound and the second fluorescent compound is blue, and
wherein an emission color of the first phosphorescent compound is green and emission color of the second phosphorescent compound is red.

37. The light emitting element according to any one of claim 27,
wherein the first phosphorescent compound and the second phosphorescent compound are a same organic compound.

38. The light emitting element according to claim 37,
wherein an emission color of the first phosphorescent compound and the second phosphorescent compound and an emission color of the first fluorescent compound and the second fluorescent compound are complementary to each other.

39. A lighting device comprising the light emitting element according to claim 27.

* * * * *